US012648271B2

(12) United States Patent
Hino et al.

(10) Patent No.: US 12,648,271 B2
(45) Date of Patent: Jun. 2, 2026

(54) LIGHT EMITTING DEVICE, HEADLIGHT, AND VEHICLE COMPRISING SAME

(71) Applicant: NICHIA CORPORATION, Anan (JP)

(72) Inventors: Haruka Hino, Tokushima (JP); Yukiko Sano, Anan (JP)

(73) Assignee: NICHIA CORPORATION, Anan (JP)

( * ) Notice: Subject to any disclaimer, the term of this patent is extended or adjusted under 35 U.S.C. 154(b) by 387 days.

(21) Appl. No.: 18/556,082

(22) PCT Filed: Mar. 7, 2022

(86) PCT No.: PCT/JP2022/009591
§ 371 (c)(1),
(2) Date: Oct. 18, 2023

(87) PCT Pub. No.: WO2022/224598
PCT Pub. Date: Oct. 27, 2022

(65) Prior Publication Data
US 2024/0234648 A1 Jul. 11, 2024

(30) Foreign Application Priority Data

Apr. 19, 2021 (JP) ................................. 2021-070652
Nov. 24, 2021 (JP) ................................. 2021-189899
Feb. 24, 2022 (JP) ................................. 2022-026600

(51) Int. Cl.
| | |
|---|---|
| *H10H 20/851* | (2025.01) |
| *C09K 11/77* | (2006.01) |
| *F21S 41/176* | (2018.01) |

(52) U.S. Cl.
CPC ..... *H10H 20/8513* (2025.01); *C09K 11/7721* (2013.01); *C09K 11/77347* (2021.01); *F21S 41/176* (2018.01); *H10H 20/8514* (2025.01)

(58) Field of Classification Search
CPC ........... H10H 20/8513; H10H 20/8514; H10H 20/851; C09K 11/7721; C09K 11/77347;
(Continued)

(56) References Cited

U.S. PATENT DOCUMENTS

| | | |
|---|---|---|
| 2003/0198060 A1 | 10/2003 | Ishida et al. |
| 2005/0094414 A1 | 5/2005 | Ishida et al. |

(Continued)

FOREIGN PATENT DOCUMENTS

| JP | H0867199 A | 3/1996 |
|---|---|---|
| JP | 2003317513 A | 11/2003 |

(Continued)

OTHER PUBLICATIONS

Hashimoto et al., "Evaluating Discomfort Glare Using White Light with LEDs of Different Color Temperatures," JARI Research Journal, vol. 28, No. 10, Oct. 2006, 4 pages.

(Continued)

*Primary Examiner* — Fernando L Toledo
*Assistant Examiner* — Shawn Shaw Muslim
(74) *Attorney, Agent, or Firm* — Hunton Andrews Kurth LLP

(57) ABSTRACT

Provided are a light emitting device capable of reducing glare, a headlight, and a vehicle including the same.
The light emitting device comprises: a light emitting element having a light emission peak wavelength in a range of 400 nm or more and 490 nm or less; and a wavelength conversion member including a first fluorescent material having a light emission peak wavelength in a range of 480 nm or more and less than 580 nm and a second fluorescent material having a light emission peak wavelength in a range of 580 nm or more and 680 nm or less and having a composition different from that of the first fluorescent material, wherein the light emitting device emits light having a (Continued)

first luminance ratio Ls/L that is 0.9 or less, where Ls/L is a ratio of a first effective radiance Ls of the light emitted by the light emitting device in consideration of a spectral luminous efficiency curve for photopic vision of humans specified by the CIE (Commission Internationale de l'Eclairage) and S-cone spectral sensitivity of humans, to a luminance L of the light emitted by the light emitting device in consideration of the spectral luminous efficiency curve for photopic vision of humans.

34 Claims, 25 Drawing Sheets

(58) Field of Classification Search
CPC ... C09K 11/7774; F21S 41/176; F21S 41/143; F21S 41/24; F21S 41/2805; F21S 41/285
See application file for complete search history.

(56) References Cited

U.S. PATENT DOCUMENTS

| | | |
|---|---|---|
| 2005/0117361 A1 | 6/2005 | Takeda et al. |
| 2006/0091790 A1 | 5/2006 | Nagatomi et al. |
| 2006/0197432 A1 | 9/2006 | Nagatomi et al. |
| 2009/0146171 A1 | 6/2009 | Okubo |
| 2013/0265757 A1 | 10/2013 | Tanaka et al. |
| 2014/0131753 A1 | 5/2014 | Ishida et al. |
| 2015/0171284 A1 | 6/2015 | Bechtel et al. |
| 2017/0005239 A1 | 1/2017 | Asai et al. |
| 2017/0186920 A1 | 6/2017 | Kumano et al. |

FOREIGN PATENT DOCUMENTS

| | | | | |
|---|---|---|---|---|
| JP | 2005123165 A | | 5/2005 | |
| JP | 2005141917 A | | 6/2005 | |
| JP | 2006124501 A | | 5/2006 | |
| JP | 2006241249 A | | 9/2006 | |
| JP | 2009141051 A | | 6/2009 | |
| JP | 2013232634 A | | 11/2013 | |
| JP | 2014112635 A | | 6/2014 | |
| JP | 2015530740 A | | 10/2015 | |
| JP | 2016072614 A | | 5/2016 | |
| JP | 2017017317 A | * | 1/2017 | ............ H01L 33/50 |
| JP | 2017117912 A | | 6/2017 | |
| JP | 2018142723 A | | 9/2018 | |
| JP | 2020098913 A | | 6/2020 | |

OTHER PUBLICATIONS

Kobayashi et al., "Study on the Effect of Headlight Source Spectrum on Discomfort Glare," The Annual Lectures of the Society of Automotive Engineers of Japan, No. 5-10, 6 pages.

* cited by examiner

[FIG. 1A]
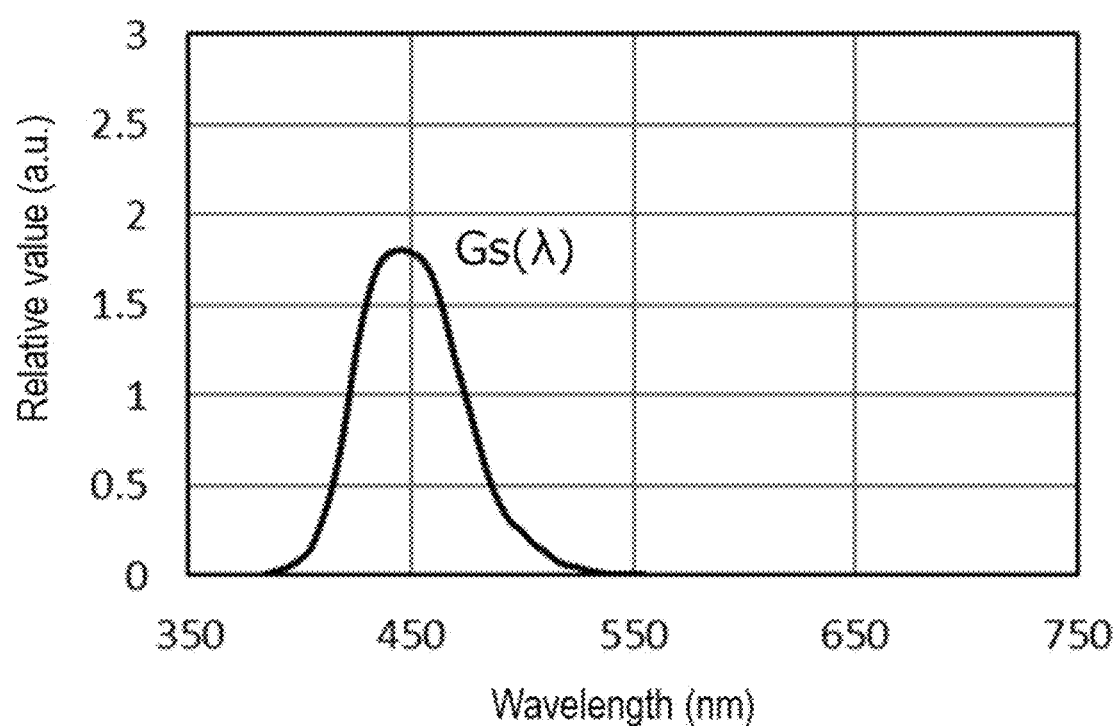

[FIG. 1B]
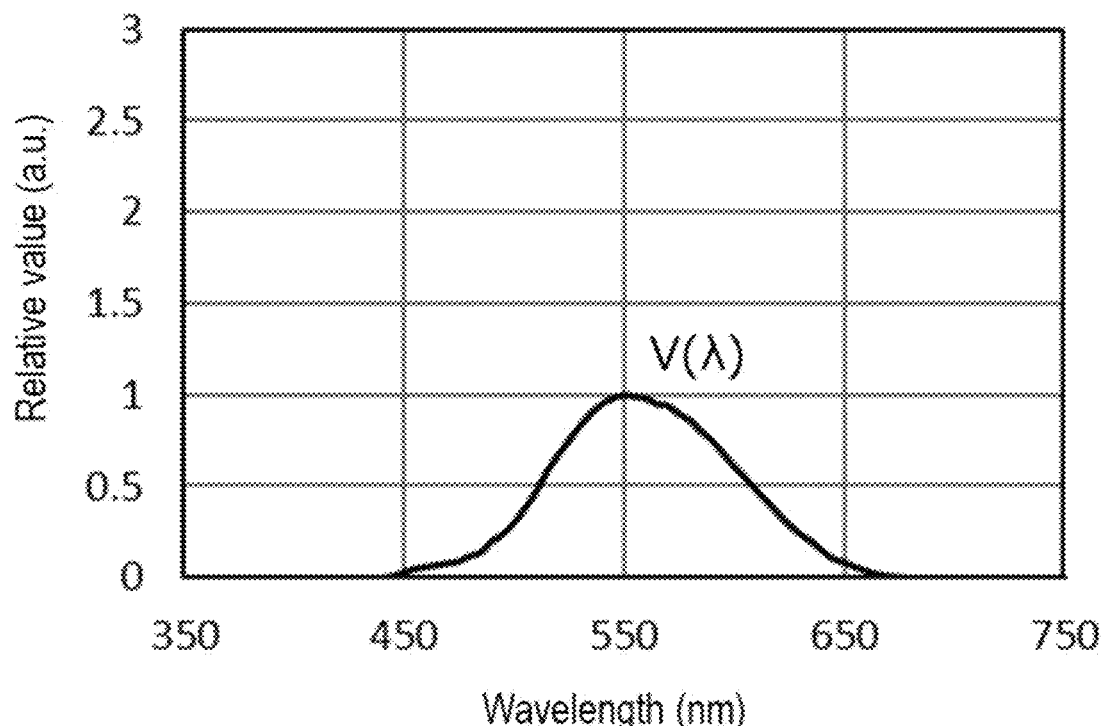

[FIG. 1C]
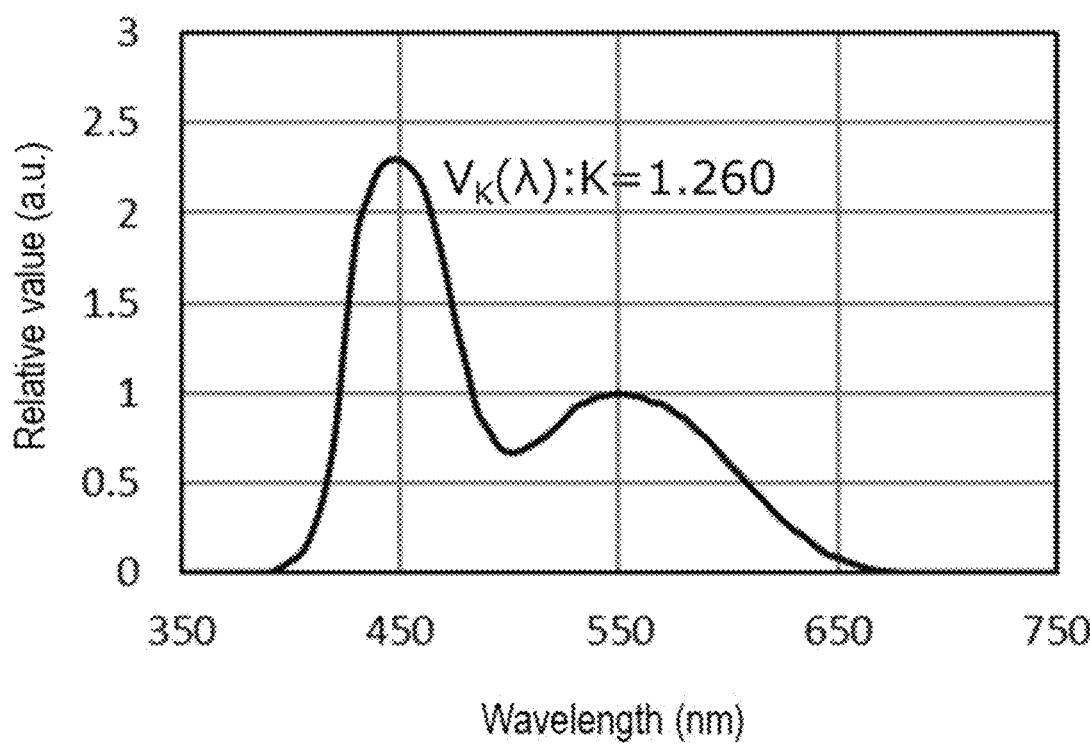

[FIG. 2]
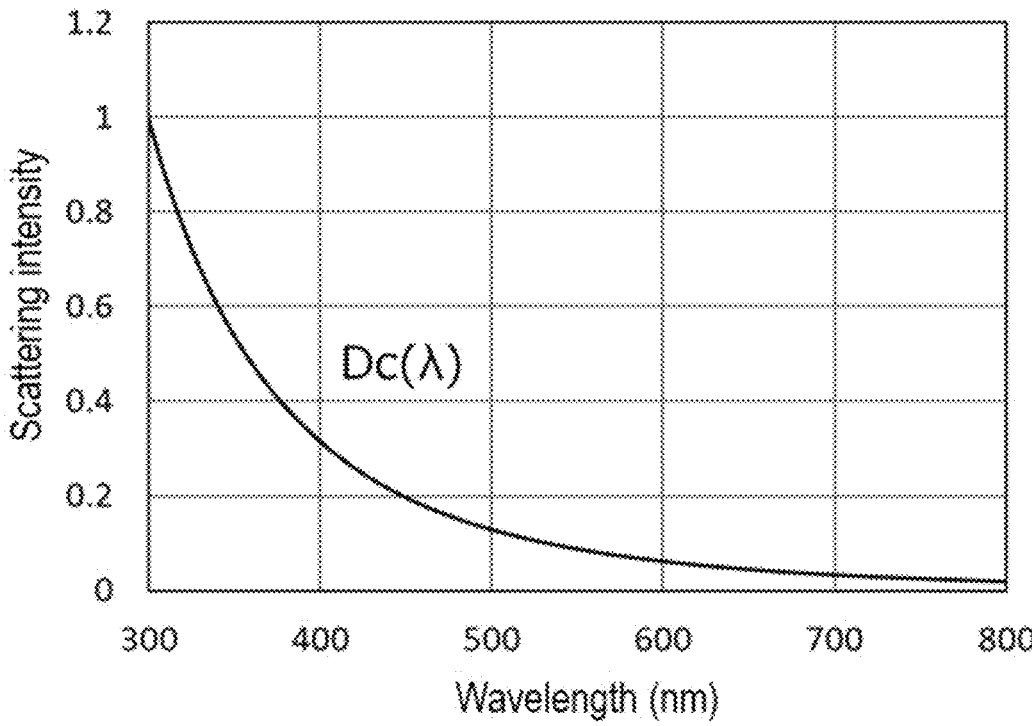

[FIG. 3A]
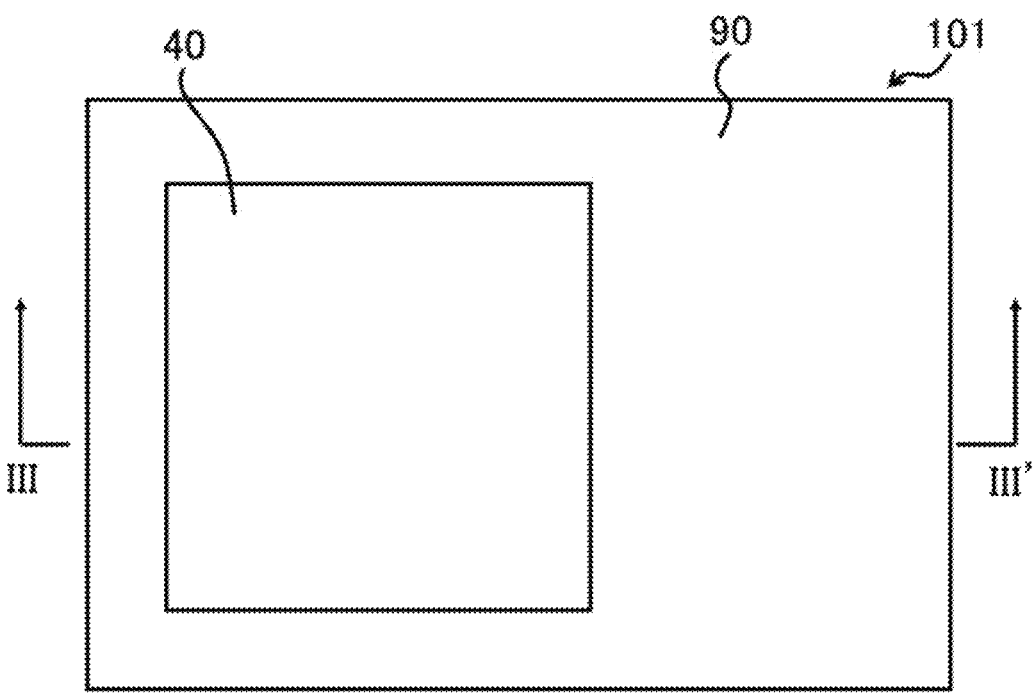

[FIG. 3B]
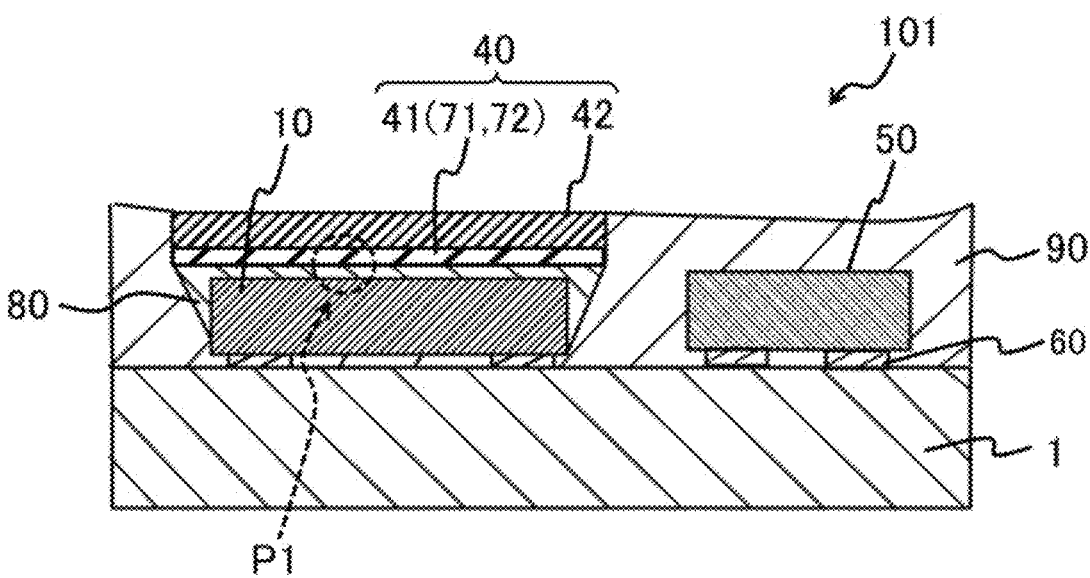

[FIG. 3C]
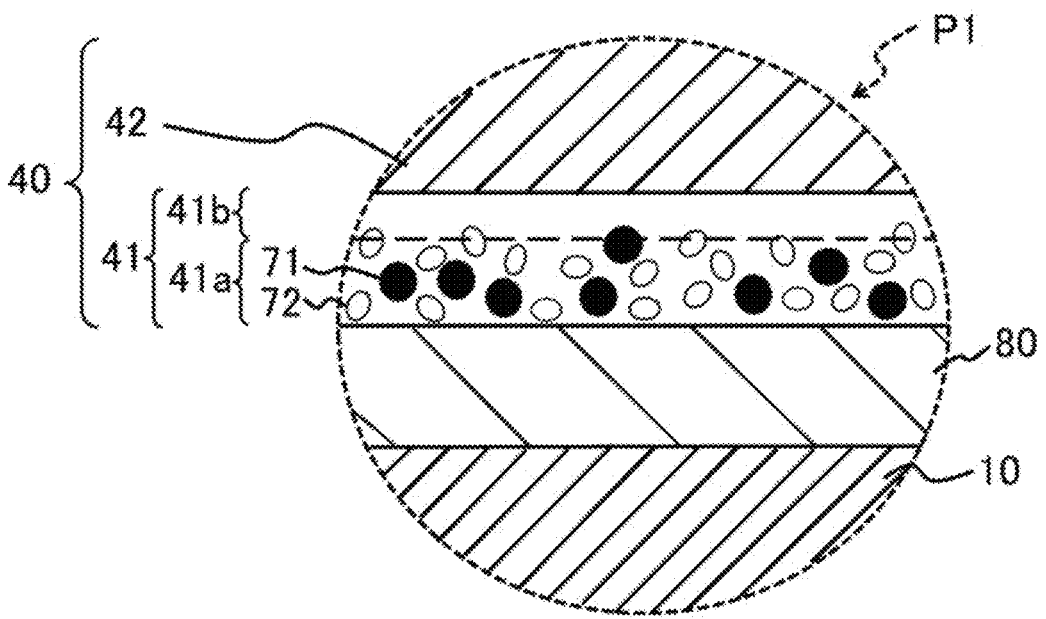

[FIG. 4]
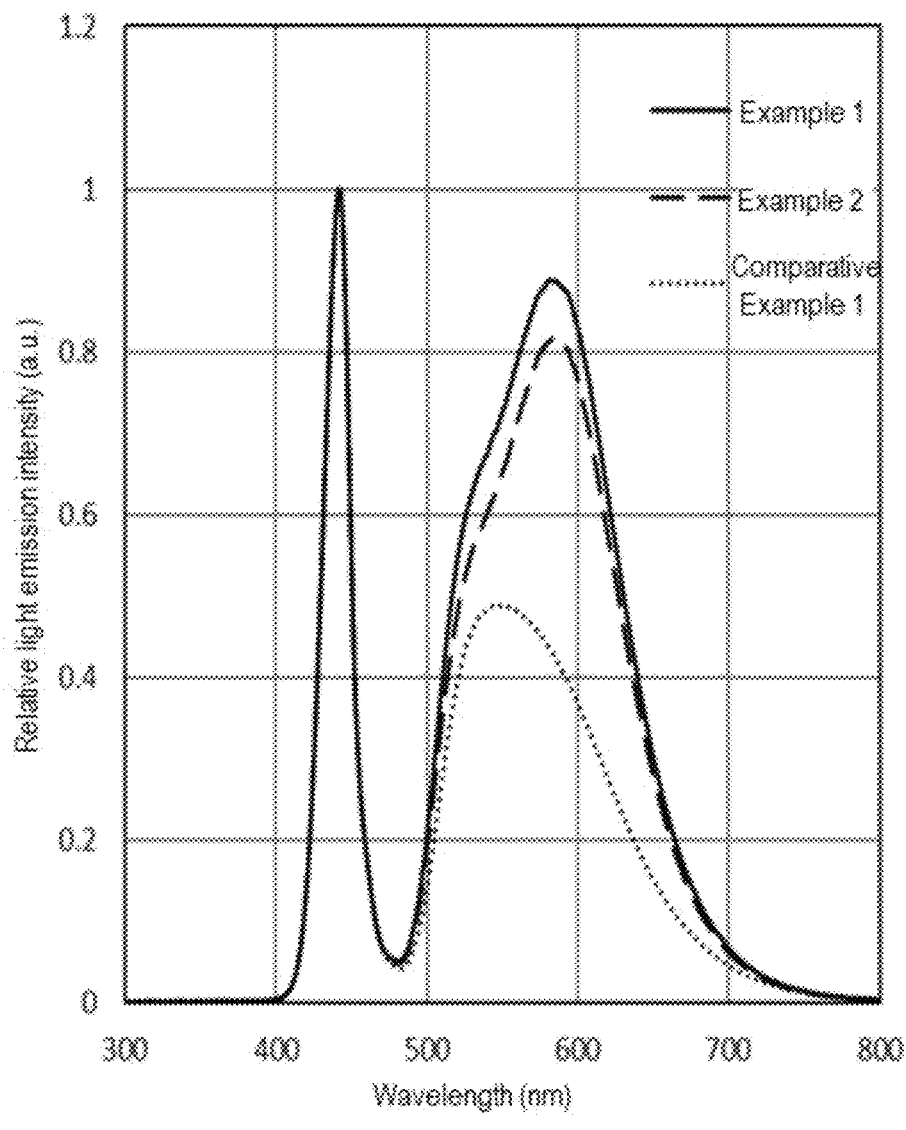

[FIG. 5]
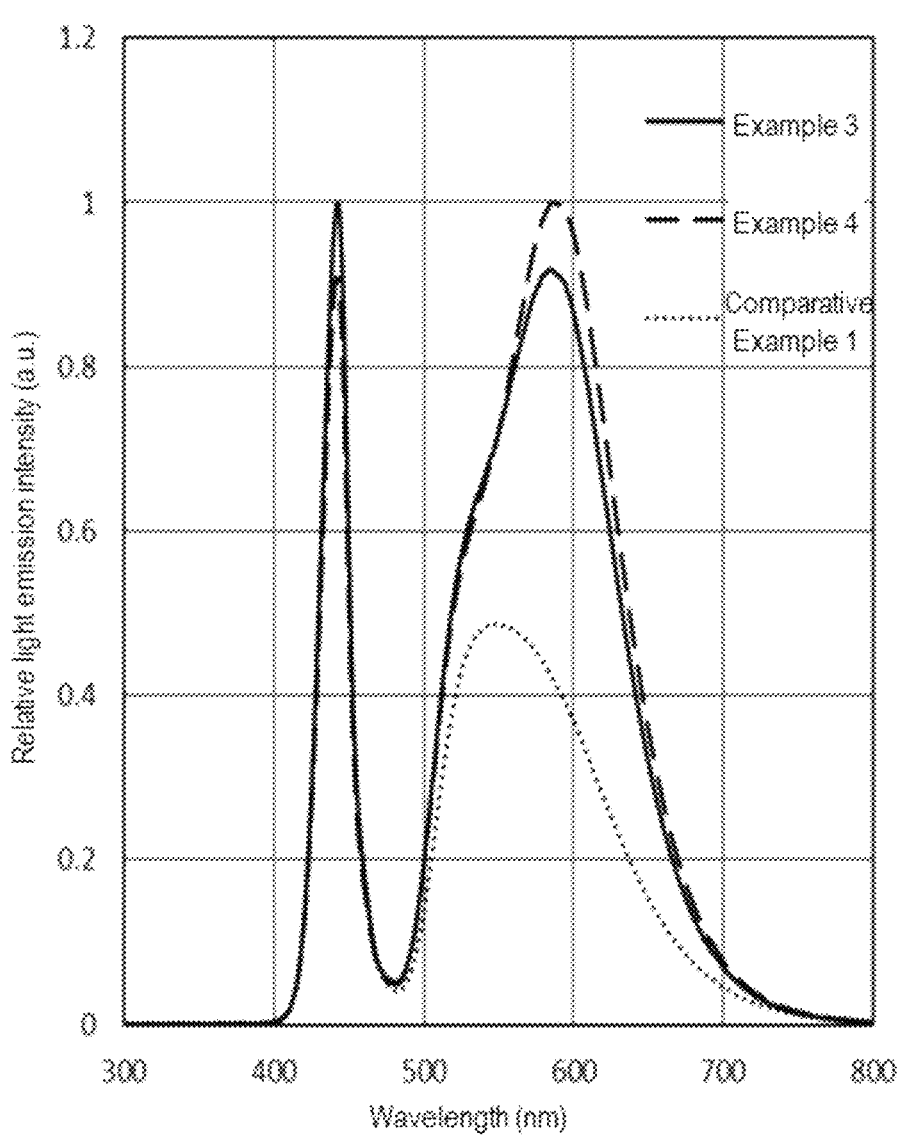

[FIG. 6]
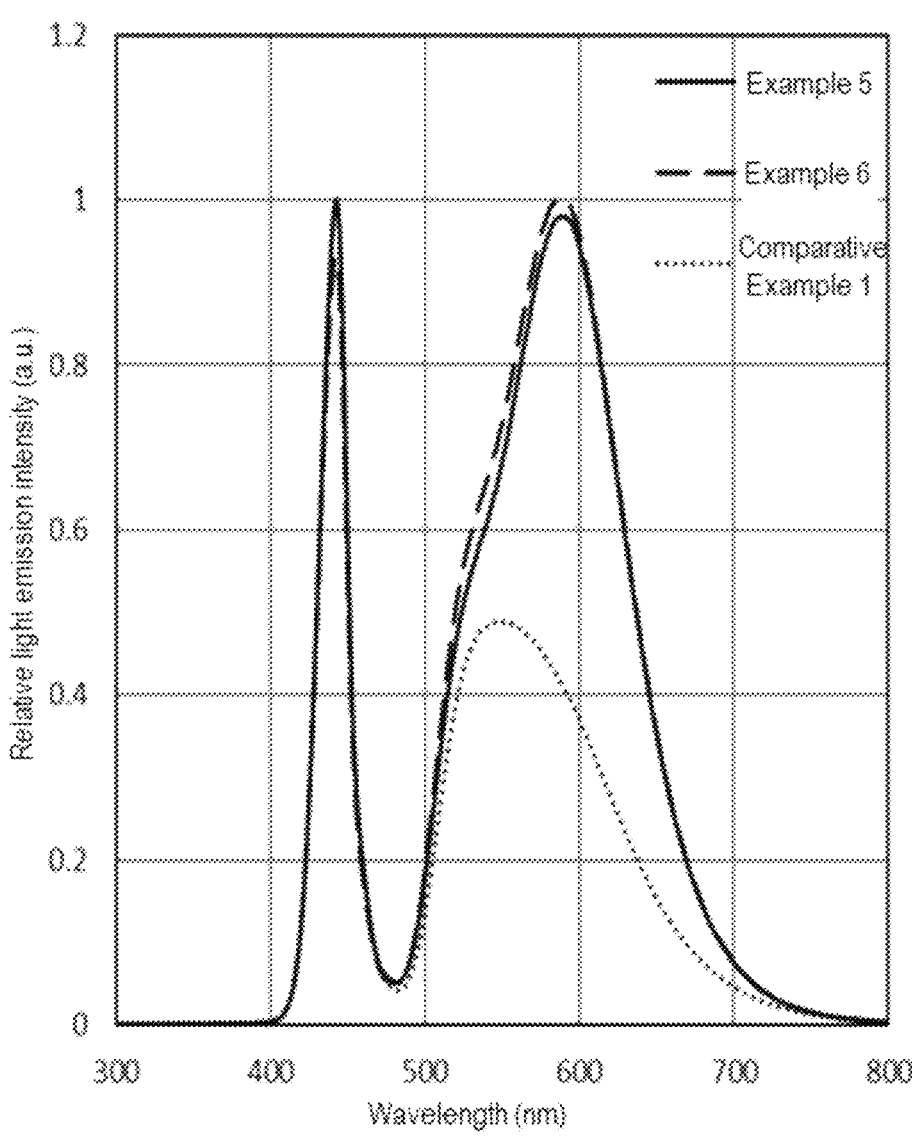

[FIG. 7]
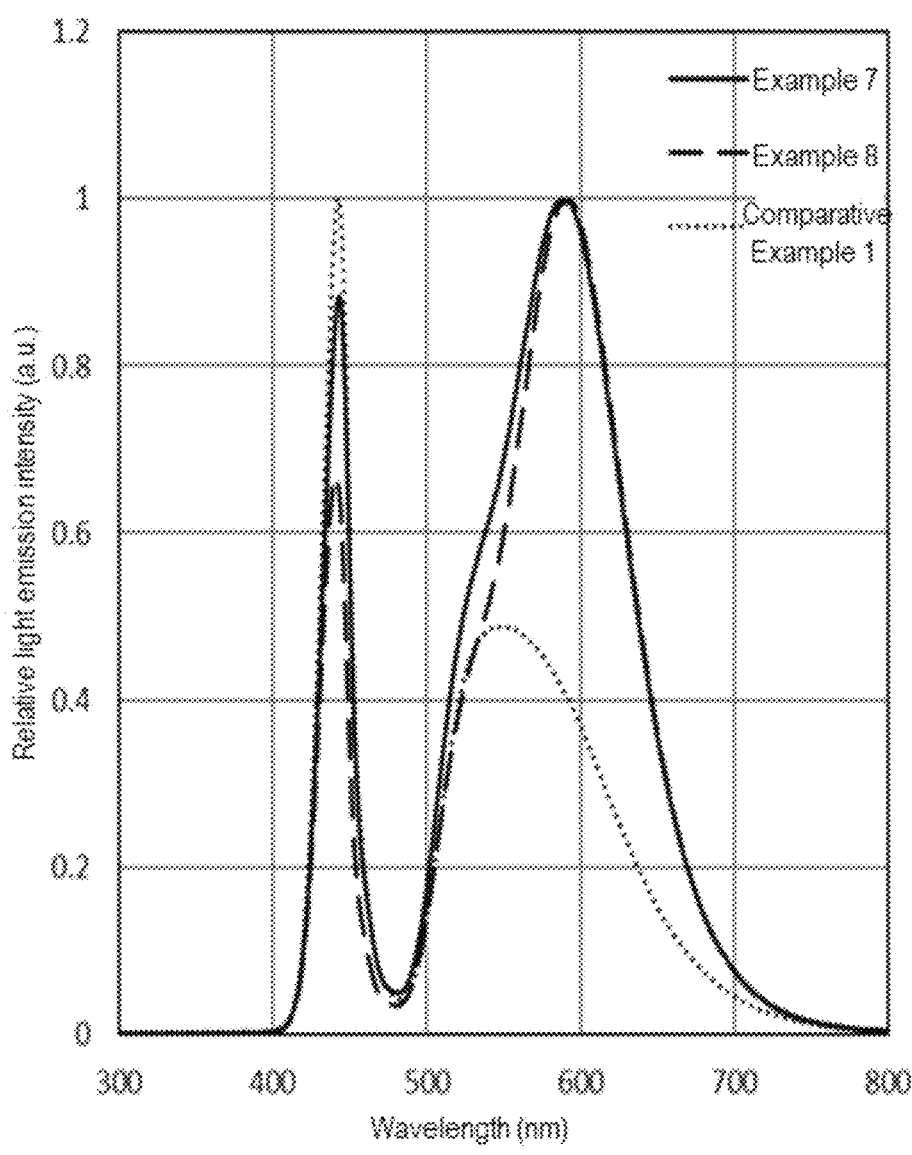

[FIG. 8]
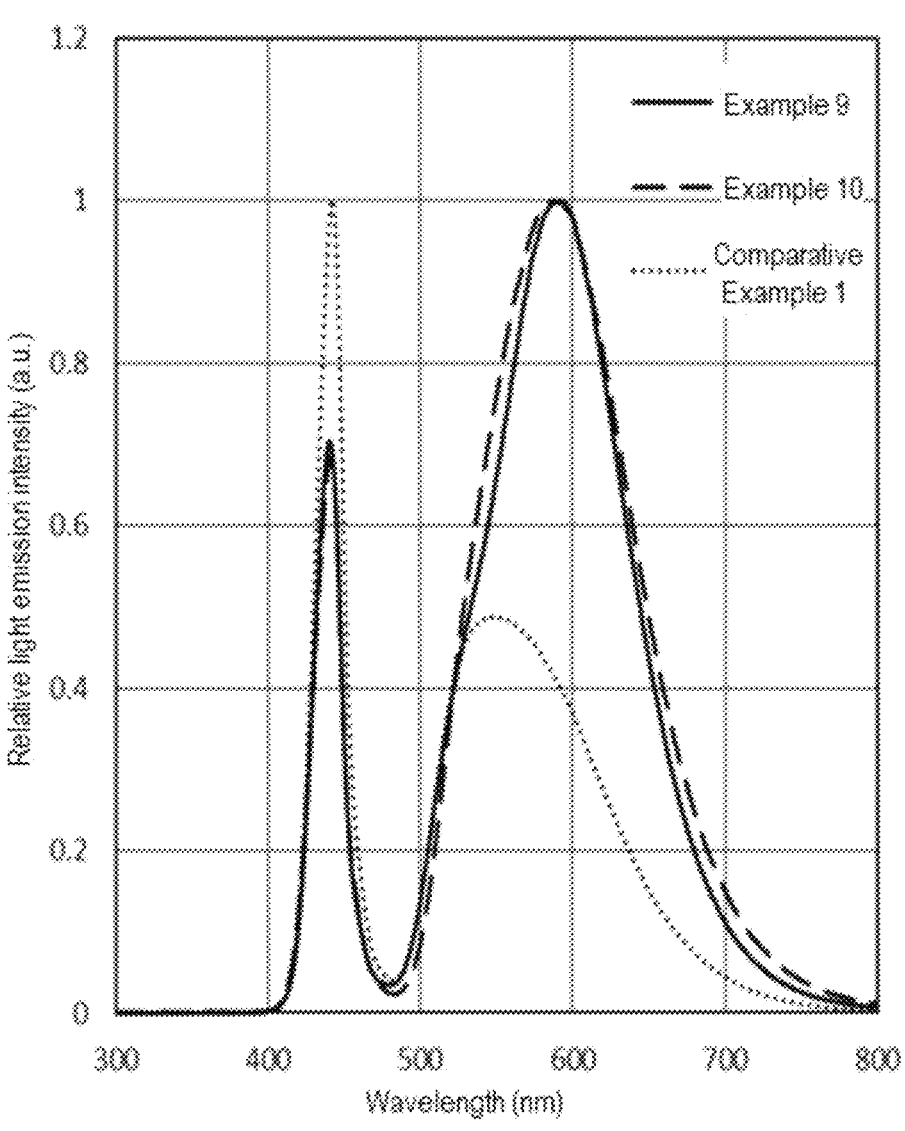

[FIG. 9]
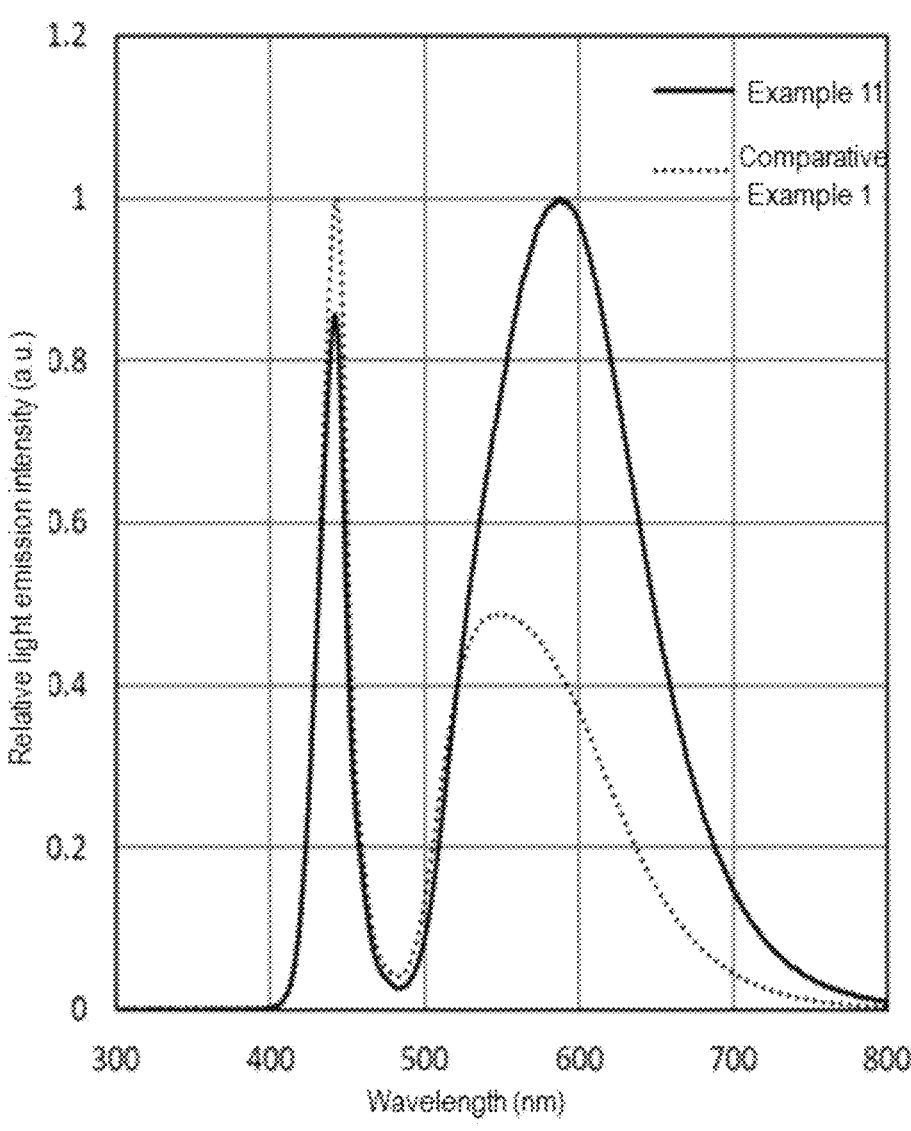

[FIG. 10]
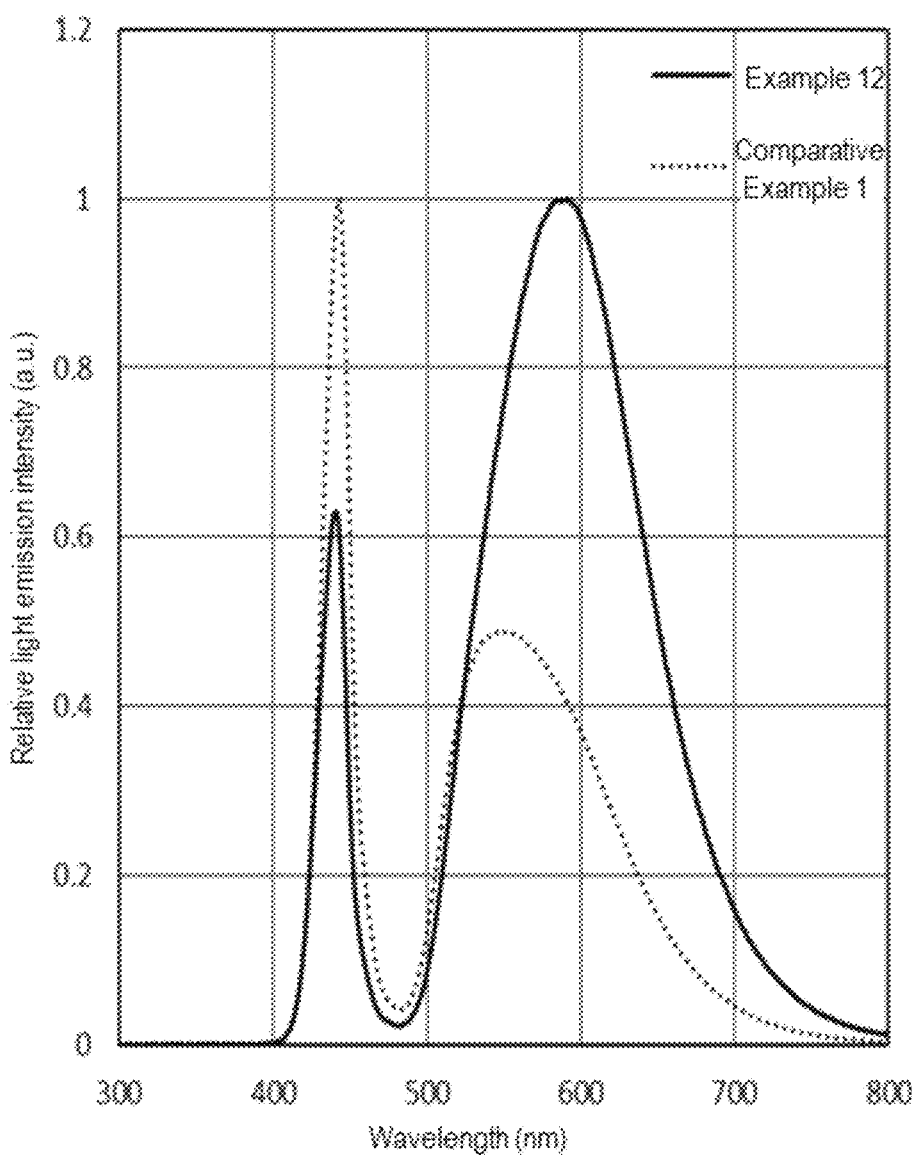

[FIG. 11]
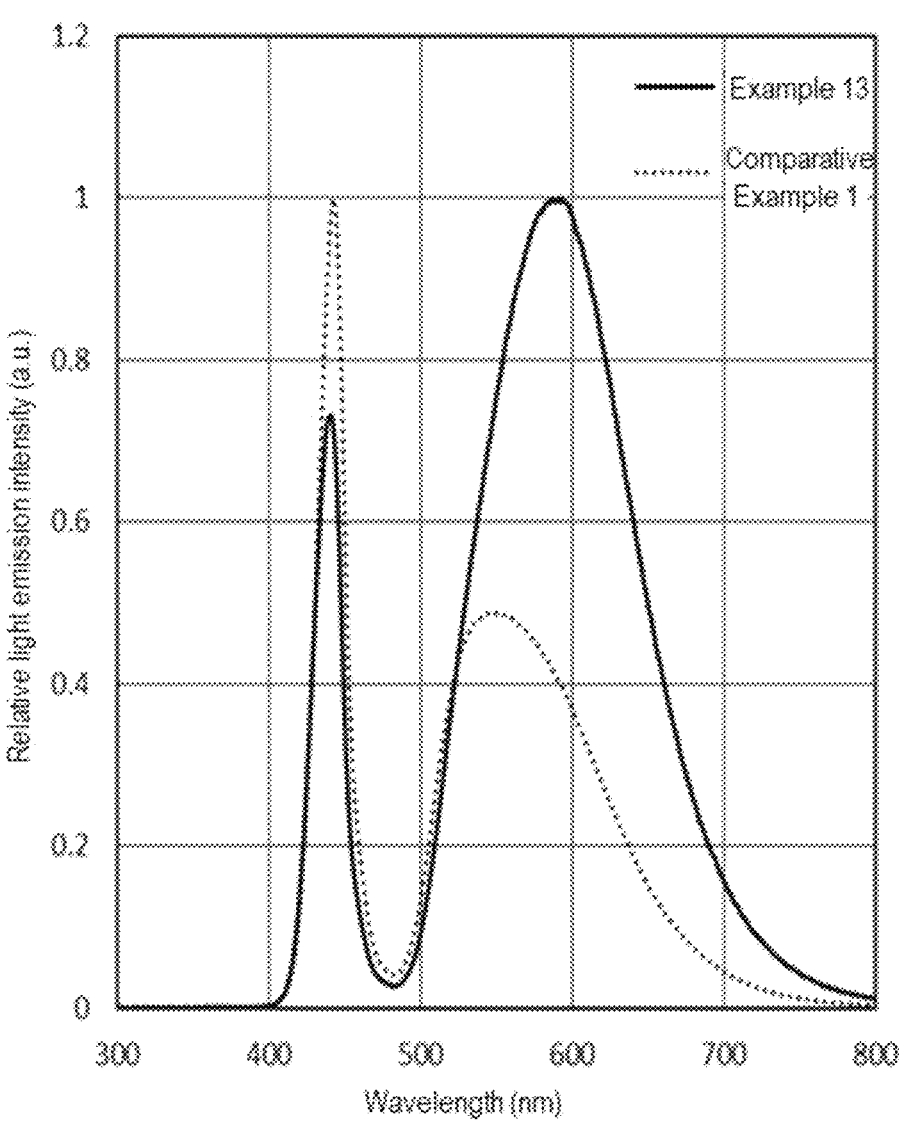

[FIG. 12]
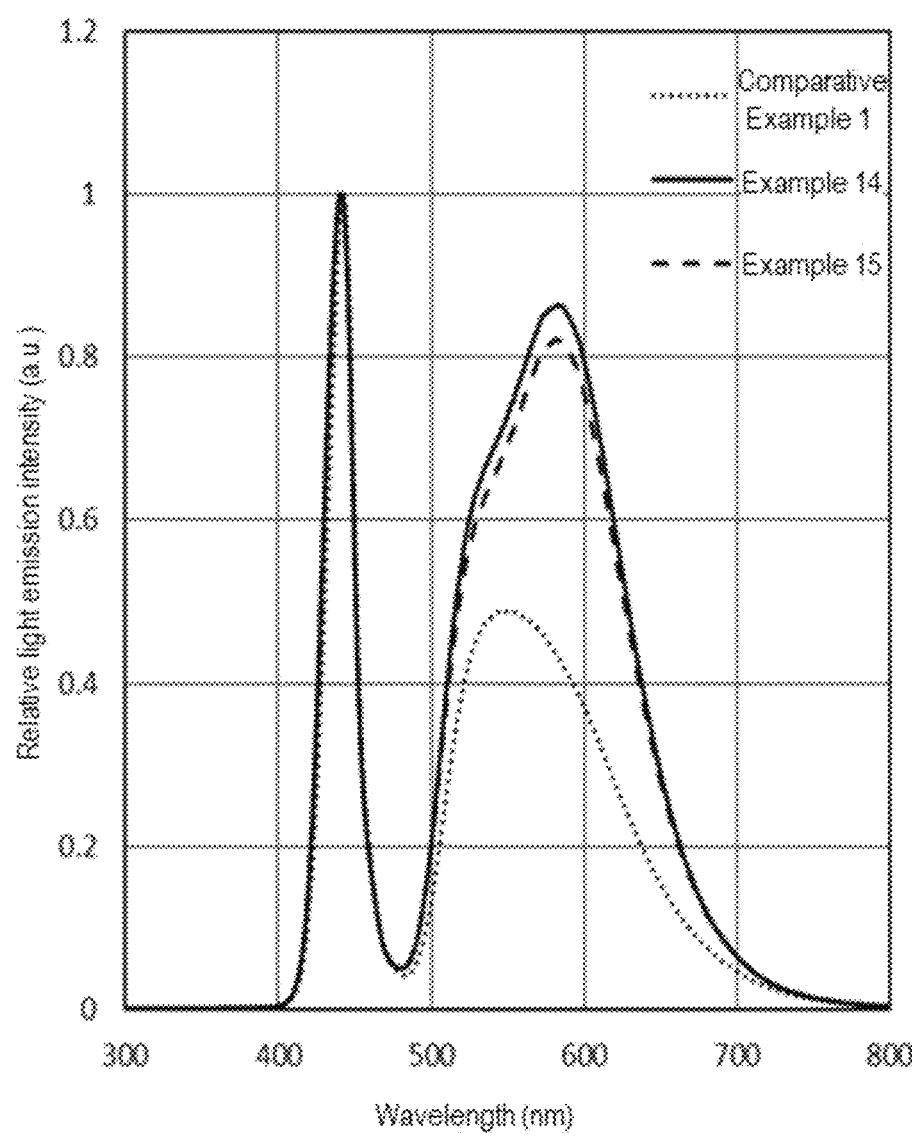

[FIG. 13]
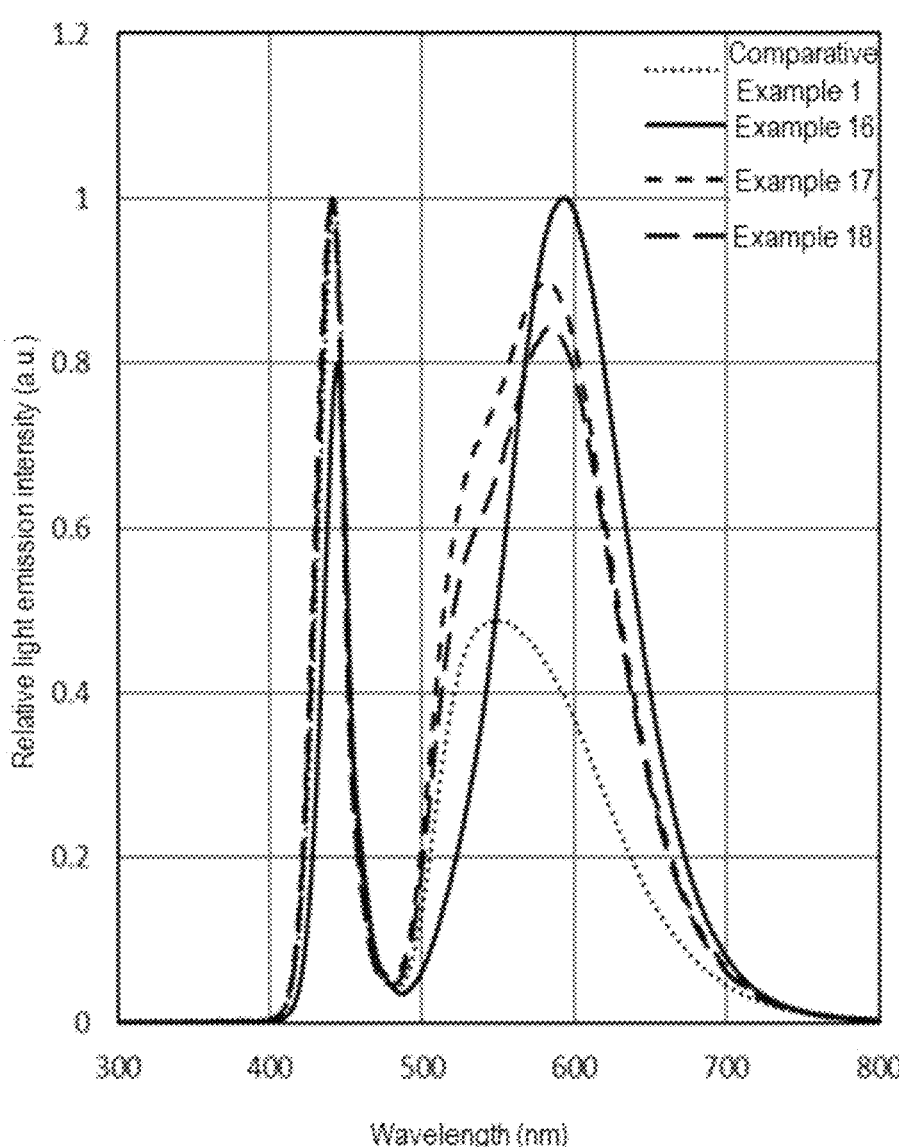

[FIG. 14]
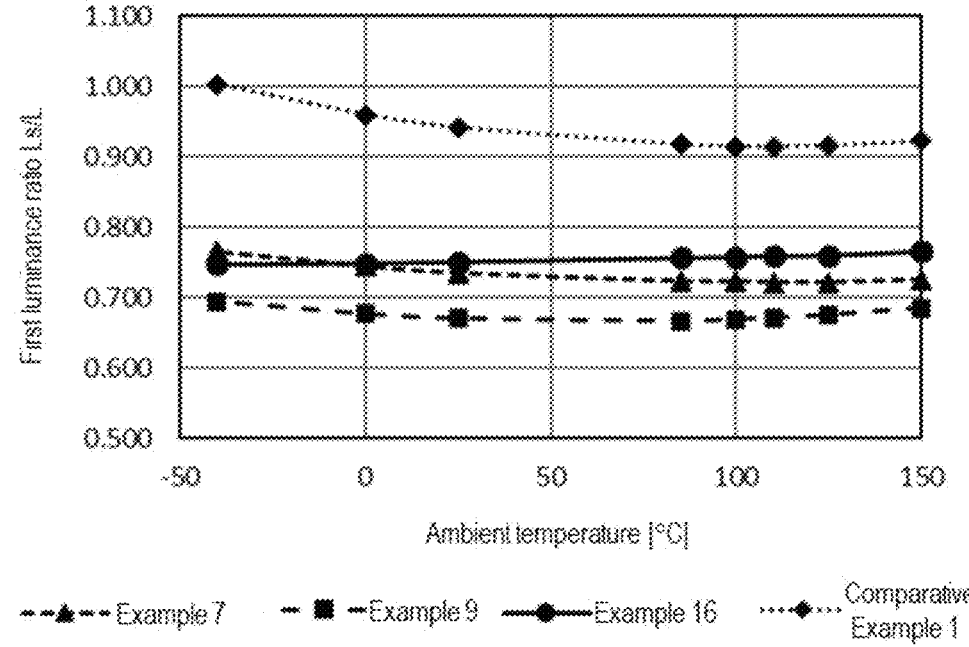

[FIG. 15]
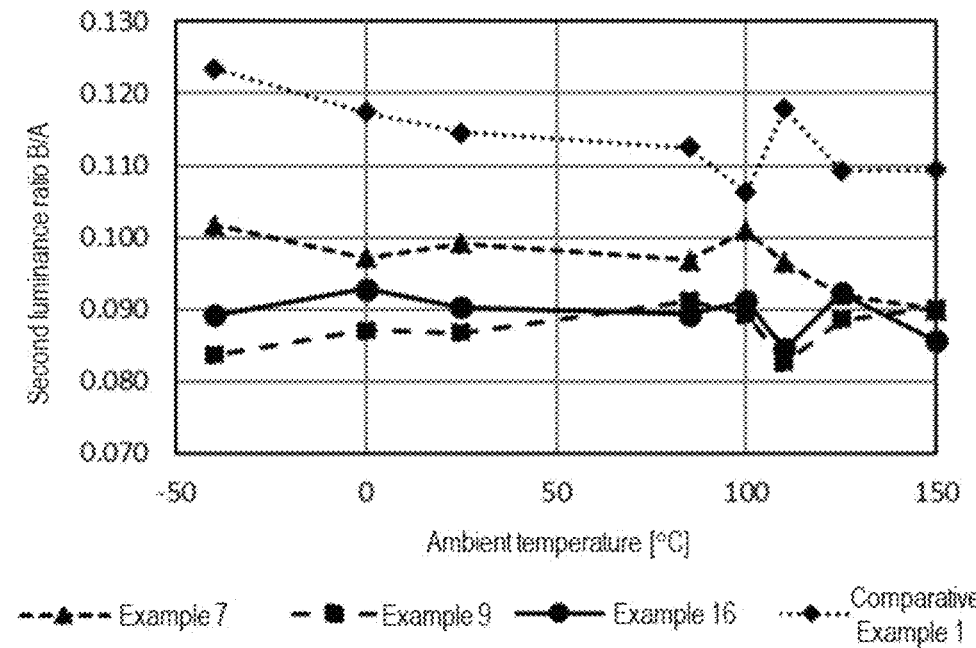

[FIG. 16]
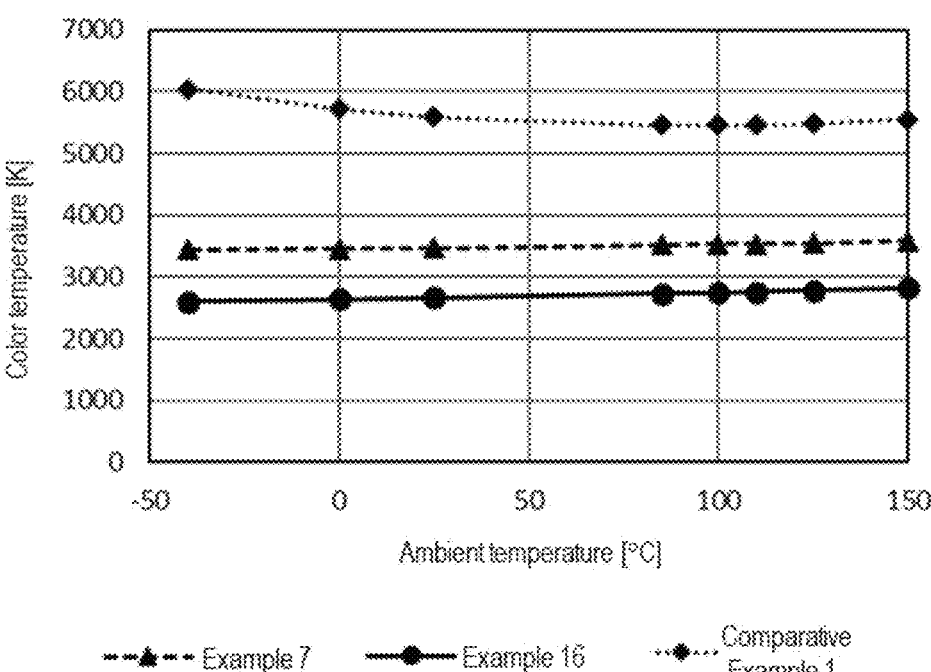

[FIG. 17]
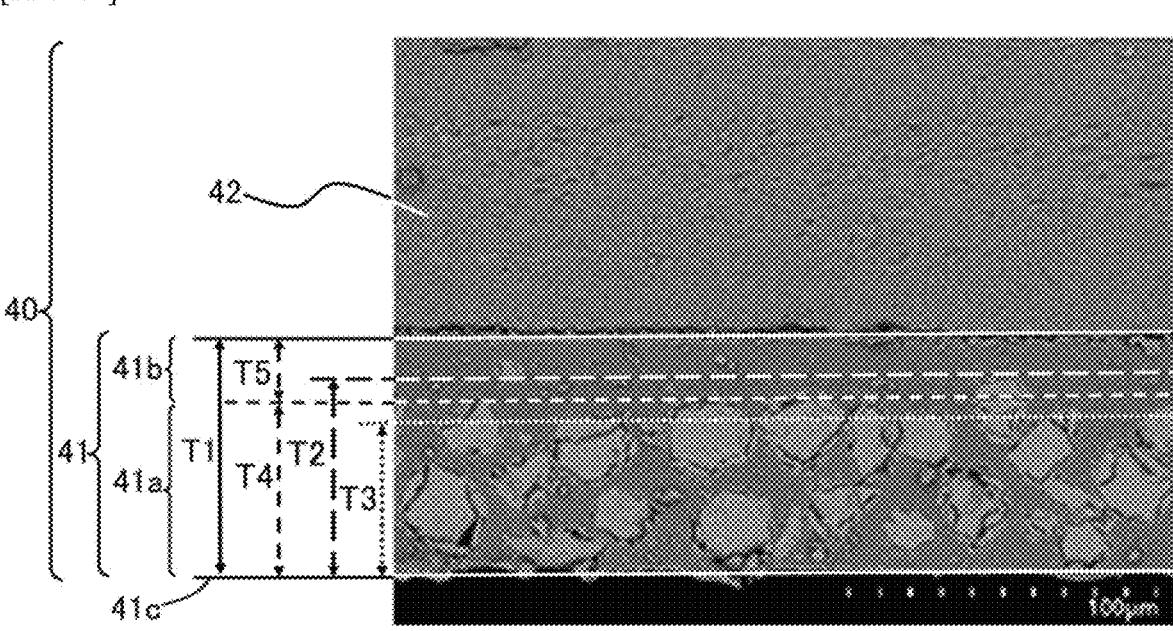

[FIG. 18]
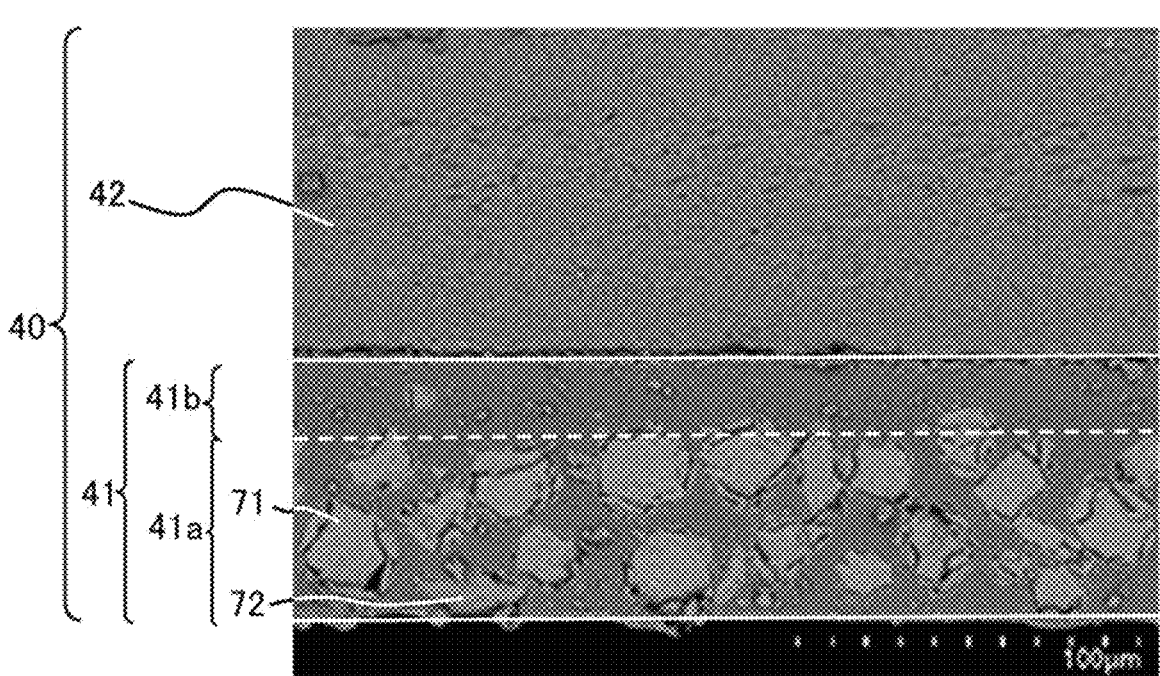

[FIG. 19]
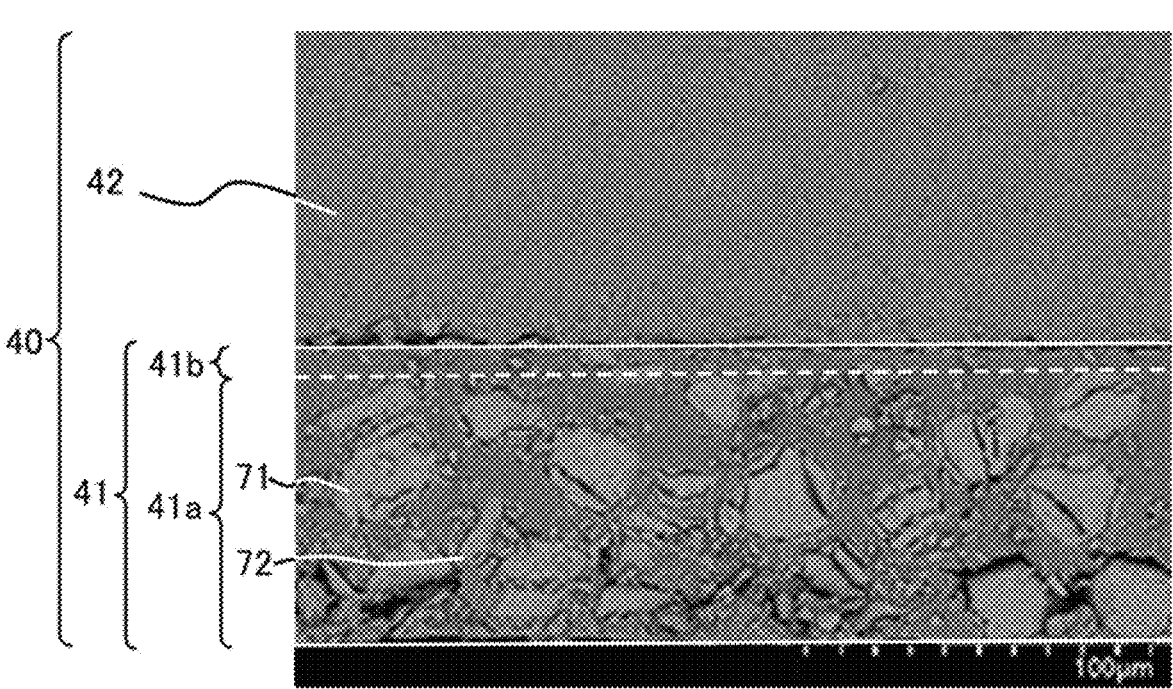

[FIG. 20]
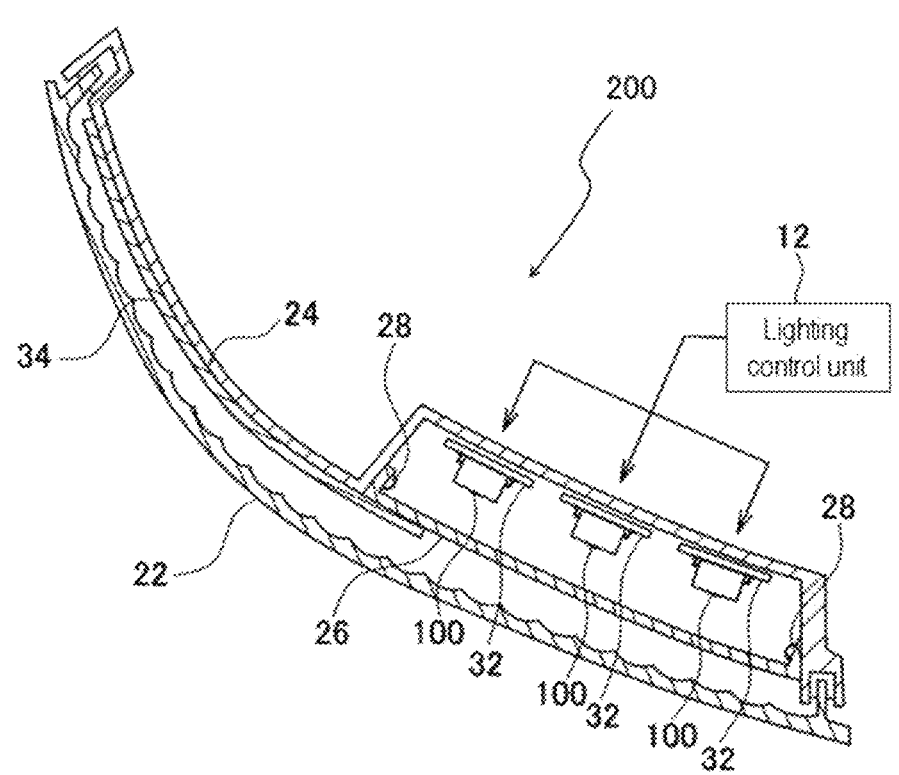

[FIG. 21]
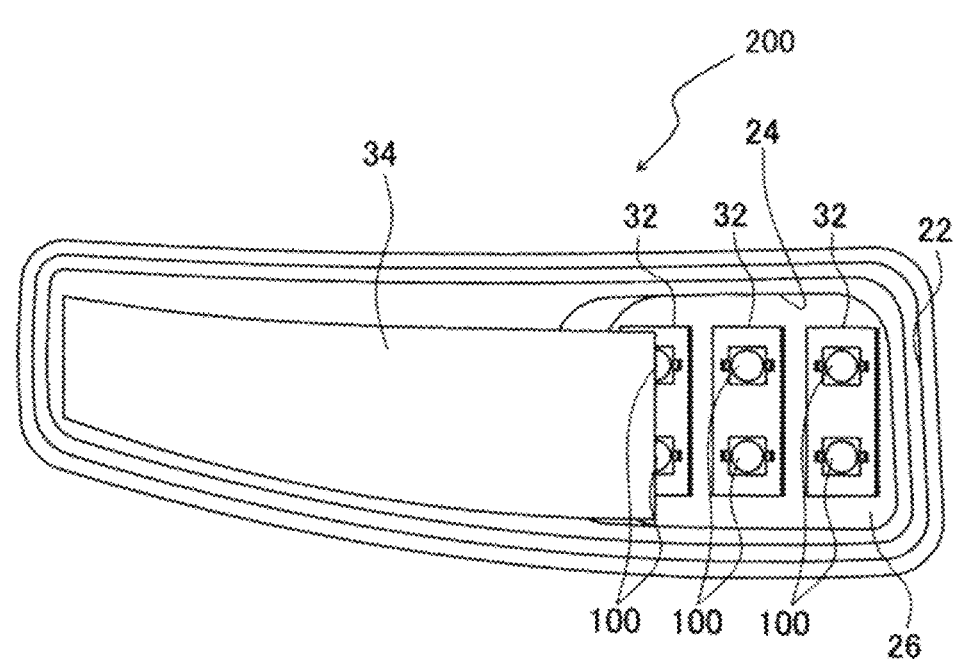

1

LIGHT EMITTING DEVICE, HEADLIGHT, AND VEHICLE COMPRISING SAME

CROSS-REFERENCE TO RELATED APPLICATION

This application is a national stage entry of International Application No. PCT/JP2022/009591, filed on Mar. 7, 2022, which claims priority to Japanese Patent Application No. 2021-070652, filed on Apr. 19, 2021, and Japanese Patent Application No. 2021-189899, filed on Nov. 24, 2021, and Japanese Patent Application No. 2022-026600, filed on Feb. 24, 2022, the disclosures of which are hereby incorporated by reference in their entireties.

TECHNICAL FIELD

The present disclosure relates to a light emitting device, a headlight, and a vehicle including the same.

BACKGROUND ART

Headlights for road transportation vehicles such as motorcycles and automobiles, and vehicles used for tractor-type construction machines such as ground leveling, transporting, and loading machines, or excavator-type construction machines such as excavating machines use lighting fixtures such as light emitting devices using halogen lamps, high-intensity discharge (HID) lamps, and semiconductor light emitting elements as excitation light sources. For example, one or more headlights for automobiles are symmetrically mounted on the left and right sides of the front end at positions lower than the driver's viewpoint. The headlights have a high beam lighting fixture (headlight for driving) and a low beam lighting fixture (headlight for passing each other), which can be switched between the two. High beams illuminate a relatively long distance, for example, up to approximately 100 m ahead, while low beams illuminate a slightly lower and closer area than high beams, for example, approximately 40 m ahead.

For example, Patent Literature 1 discloses a vehicular headlight including a first lighting fixture unit that is lit in a low beam mode, and a first lighting fixture unit and a second lighting fixture unit that are simultaneously lit in a high beam mode. Patent Literature 1 discloses a first lighting fixture unit using a white light emitting device (LED) that emits light at a correlated color temperature of 4,000 K to 6,500 K as a light source, and a second lighting fixture unit using a metal halide lamp, which is a type of HID lamp, that emits light at a correlated color temperature of 4,000 K to 5,000 K as a light source.

CITATION LIST

Patent Literature

Patent Literature 1: Japanese Unexamined Patent Publication No. 2005-141917

SUMMARY OF THE INVENTION

Problem to be Solved by the Invention

Light emitted by vehicle headlights may stimulate the vision of drivers of preceding or oncoming vehicles, causing glare that makes them feel uncomfortable and difficult to see objects. Glare is a sensation caused by unsuitable luminance distribution or extreme luminance contrast in the visual field, and is associated with discomfort and reduction in viewing ability (Japanese Industrial Standard (JIS) Z9110). Furthermore, the light emitted by the headlight may cause glare to the driver of the driving vehicle itself due to reflected light.

Accordingly, aspects of the present disclosure are to provide a light emitting device capable of reducing glare, a headlight, and a vehicle including the same.

Means for Solving Problem

A first aspect of the present disclosure relates to a light emitting device including: a light emitting element having a light emission peak wavelength in a range of 400 nm or more and 490 nm or less; and a wavelength conversion member including a first fluorescent material having a light emission peak wavelength in a range of 480 nm or more and less than 580 nm and a second fluorescent material having a light emission peak wavelength in a range of 580 nm or more and 680 nm or less and having a composition different from a composition of the first fluorescent material, wherein the light emitting device emits light having a first luminance ratio Ls/L, as derived from the following formula (1), that is 0.9 or less, wherein the first luminance ratio Ls/L is a ratio of a first effective radiance Ls of the light emitted by the light emitting device in a range of 380 nm or more and 780 nm or less in consideration of a spectral luminous efficiency curve for photopic vision of humans specified by the CIE (Commission Internationale de l'Eclairage) and S-cone spectral sensitivity of humans, to a luminance L of the light emitted by the light emitting device in a range of 380 nm or more and 780 nm or less in consideration of the spectral luminous efficiency curve for photopic vision of humans.

$$Ls/L = \frac{\int_{380}^{780} S(\lambda)\{1.260 \times Gs(\lambda) + V(\lambda)\}d\lambda}{2.3\int_{380}^{780} S(\lambda) \times V(\lambda)d\lambda} \quad (1)$$

wherein S ($\lambda$) represents a spectral radiance of the light emitted by the light emitting device, V ($\lambda$) represents a spectral luminous efficiency curve for photopic vision of humans specified by the CIE, and Gs ($\lambda$) represents an S-cone spectral sensitivity of humans in a wavelength $\lambda$ range of 380 nm or more and 550 nm or less.

A second aspect of the present disclosure relates to a light emitting device including: a light emitting element having a light emission peak wavelength in a range of 400 nm or more and 490 nm or less; and a wavelength conversion member including a first fluorescent material having a light emission peak wavelength in a range of 480 nm or more and less than 580 nm and a second fluorescent material having a light emission peak wavelength in a range of 580 nm or more and 680 nm or less and having a composition different a composition of the first fluorescent material, wherein the light emitting device emits light having a second luminance ratio B/A, as derived from the following formula (2), that is 0.104 or less, wherein the second luminance ratio B/A is a ratio of a second effective radiance B of the light emitted by the light emitting device in a range of 300 nm or more and 800 nm or less in consideration of a scattering intensity curve for wavelengths when a scattering intensity of Rayleigh scattering at a wavelength of 300 nm is 1, to a radiance A of the light emitted by the light emitting device in a range of 300 nm or more and 800 nm or less.

$$B/A = \frac{\int_{300}^{800} Dc(\lambda) \times S(\lambda) d\lambda}{\int_{300}^{800} S(\lambda) d\lambda} \quad (2)$$

wherein S ($\lambda$) represents a spectral radiance of the light emitted by the light emitting device and Dc ($\lambda$) represents a scattering intensity curve when a scattering intensity of Rayleigh scattering at a wavelength of 300 nm is 1.

A third aspect of the present disclosure relates to a headlight including the light emitting device.

A fourth aspect of the present disclosure relates to a vehicle including the light emitting device or the headlight.

Effect of the Invention

In accordance with the aspects of the present disclosure, a light emitting device capable of reducing glare, a headlight, and a vehicle including the same can be provided.

BRIEF DESCRIPTION OF DRAWINGS

FIG. 1A is an S-cone spectral sensitivity Gs ($\lambda$) of humans disclosed in Non-Patent Literature 2.

FIG. 1B is a spectral luminous efficiency curve for photopic vision V ($\lambda$) of humans, which is specified by the CIE, disclosed in Non-Patent Literature 2.

FIG. 1C is a curve corresponding to $V_K$ ($\lambda$): K=1.260 disclosed in Non-Patent Literature 2, and is an example of spectral luminous sensitivity $V_K$ ($\lambda$) corresponding to glare.

FIG. 2 is a graph showing an intensity curve Dc ($\lambda$) of Rayleigh scattering with a scattering intensity of 1 at a wavelength of 300 nm.

FIG. 3A is a schematic plan view showing an exemplary light emitting device.

FIG. 3B is a schematic cross-sectional view showing an exemplary light emitting device.

FIG. 3C is a partially enlarged view of a schematic cross section of an exemplary light emitting device.

FIG. 4 is an exemplary graph showing light emission spectra of light emitting devices according to Examples 1 and 2 and Comparative Example 1.

FIG. 5 is an exemplary graph showing light emission spectra of light emitting devices according to Examples 3 and 4 and Comparative Example 1.

FIG. 6 is an exemplary graph showing light emission spectra of light emitting devices according to Examples 5 and 6 and Comparative Example 1.

FIG. 7 is an exemplary graph showing light emission spectra of light emitting devices according to Examples 7 and 8 and Comparative Example 1.

FIG. 8 is an exemplary graph showing light emission spectra of light emitting devices according to Examples 9 and 10 and Comparative Example 1.

FIG. 9 is an exemplary graph showing light emission spectra of light emitting devices according to Examples 11 and Comparative Example 1.

FIG. 10 is an exemplary graph showing light emission spectra of light emitting devices according to Examples 12 and Comparative Example 1.

FIG. 11 is an exemplary graph showing light emission spectra of light emitting devices according to Examples 13 and Comparative Example 1.

FIG. 12 is an exemplary graph showing light emission spectra of light emitting devices according to Examples 14 and 15 and Comparative Example 1.

FIG. 13 is an exemplary graph showing light emission spectra of light emitting devices according to Examples 16, 17, and 18 and Comparative Example 1.

FIG. 14 is an exemplary graph showing a relationship between environmental ambient temperatures and first luminance ratios Ls/L for light emitting devices according to Examples 7, 9, and 16 and Comparative Example 1.

FIG. 15 is an exemplary graph showing a relationship between environmental ambient temperatures and second luminance ratios B/A for light emitting devices according to Examples 7, 9, and 16 and Comparative Example 1.

FIG. 16 is an exemplary graph showing a relationship between environmental ambient temperatures and correlated color temperatures for light emitting devices according to Examples 7 and 16 and Comparative Example 1.

FIG. 17 is an SEM micrograph showing an exemplary cut surface of a wavelength conversion member sample according to Example 18.

FIG. 18 is an SEM micrograph showing an exemplary cut surface of a wavelength conversion member sample according to Example 18.

FIG. 19 is an SEM micrograph showing an exemplary cut surface of a wavelength conversion member sample according to Example 3.

FIG. 20 is a diagram showing a horizontal cross-sectional view of an exemplary headlight.

FIG. 21 is a diagram showing a front view of an exemplary headlight.

MODE(S) FOR CARRYING OUT THE INVENTION

The embodiments of the present disclosure are hereunder described by reference to the accompanying drawings. The embodiments described below are those exemplifying a light emitting device, a headlight, and a vehicle including the same for the purpose of embodying the technical idea of the present disclosure, and the present disclosure is not limited to the following light emitting device, the headlight, and the vehicle including the same. In addition, the members described in the claims are by no means limited to members of the embodiments. Especially, unless otherwise specified, any dimensions, materials, shapes, and relative arrangements of the structural members described in the embodiments are not intended to limit the scope of the present disclosure only but are merely explanatory examples. The relationships between color names and chromaticity coordinates, and the relationships between wavelength ranges of light and color names of monochromic light are in accordance with Japanese Industrial Standard JIS Z8110. In the present specification, unless otherwise specified, in the case where plural substances corresponding to each component are present in the composition, the content of each component in the composition means a total amount of the plural substances present in the composition. The full width at half maximum in the light emission spectrum refers to a full width at half maximum (FWHM). The full width at half maximum of a light emitting device or fluorescent material means a wavelength width of a light emission spectrum that exhibits 50% of the maximum light emission intensity in the light emission spectrum.

Various light sources such as HID lamps, halogen lamps, and light emitting devices using LEDs are used in vehicle headlights depending on the characteristics such as luminous flux and energy. Differences in light sources result in different levels of glare, which makes humans feel dazzled, and different levels of apparent brightness. For example, the brightness of road surfaces is also affected by the blue light component and the correlated color temperature of the light. Non-Patent Literature 1 discloses an evaluation that humans feel dazzling with LED light sources having a high color temperature of, for example, 6,600 K, regardless of whether they are elderly or non-elderly (Non-Patent Literature 1: "Effects of Different Color Temperatures of White LEDs on Glare" by Hiroshi Hashimoto et al., Japan Automobile Research Institute, Preventive Safety Research Department, October 2006, Automotive Research, Vol. 28, No. 10, pp. 569-572). The glare that humans feel uncomfortable varies depending on the decrease in human retinal illumination and the deterioration of rod cells, and it may also vary depending on the age of humans. Among cone cells, which are photo-receptive cells present in the human retina, S-cone cells are photoreactive to short-wavelength light. The S-cone cells have a peak wavelength of sensitivity around 440 nm. Non-Patent Literature 2 discloses the following formula (3) for a novel spectral luminous sensitivity $V_K (\lambda)$ correspond-ing to glare, in consideration of the spectral luminous efficiency curve for photopic vision $V (\lambda)$ of humans used in the side optical system of the CIE 1931 color system and the S-cone spectral sensitivity $Gs (\lambda)$ of humans at a wavelength of $\lambda$ (Non-Patent Literature 2: "Research on the Effect of Spectral Distribution of Headlamp Light Source on Discom-fort Glare" by Shouji Kobayashi, et al., Preprint of Aca-demic Lecture Meeting of Society of Automotive Engineers of Japan, No. 5 to 10, pp. 9-14). In the present specification, spectral radiance is synonymous with spectral distribution.

$$V_K(\lambda) = 1.260 \times Gs(\lambda) + V(\lambda) \tag{3}$$

FIG. 1A shows an S-cone spectral sensitivity $Gs (\lambda)$ of humans disclosed in Non-Patent Literature 2. Based on FIG. 1A, the numerical value of the S-cone spectral sensitivity $Gs (\lambda)$ of humans can be derived. The S-cone spectral sensi-tivity $Gs (\lambda)$ of humans has a spectral sensitivity peak in a range of 380 nm or more and 550 nm or less. FIG. 1B shows a spectral luminous efficiency curve for photopic vision $V (\lambda)$ of humans, which is specified by the CIE, disclosed in Non-Patent Literature 2. The relative values shown in FIGS. 1A to 1C are values when the peak top of the spectral luminous efficiency curve for photopic vision $V (\lambda)$ of humans specified by the CIE is 1. Based on FIG. 1B, the numerical value of the spectral luminous efficiency curve for photopic vision $V (\lambda)$ of humans specified by the CIE can be derived. FIG. 1C shows a curve corresponding to $V_K (\lambda)$: K=1.260 disclosed in Non-Patent Literature 2, and is an example of spectral luminous sensitivity $V_K (\lambda)$ correspond-ing to glare, in consideration of the spectral luminous efficiency curve for photopic vision of humans specified by the CIE and the S-cone spectral sensitivity of humans. K represents a coefficient that determines the percentage con-tribution of the S-cone spectral sensitivity $Gs (\lambda)$ of humans. The coefficient K for halogen lamps is 1.260.

The luminance L of light emitted by the light emitting device is derived by the following formula (4). The lumi-nance L of light emitted by the light emitting device is an integrated value of the spectral radiance $S (\lambda)$ of the light emitting device in a range of 380 nm or more and 780 nm or less and the spectral luminous efficiency curve for pho-topic vision $V (\lambda)$ of humans specified by the CIE.

$$L = \int_{380}^{780} S(\lambda) \times V(\lambda) d\lambda \tag{4}$$

The first effective radiance Ls of light emitted by the light emitting device is derived by the following formula (5). The first effective radiance Ls of light emitted by the light emitting device is a numerical value obtained by dividing the integrated value of the spectral radiance $S (\lambda)$ of the light emitting device in the range of 380 nm or more and 780 nm or less and the human spectral luminous sensitivity $V_K (\lambda)$ ($=K \cdot Gs (\lambda)+V (\lambda)$) corresponding to glare represented by the formula (3), by 2.3 that is the peak top of $V_K (\lambda)$ derived by the formula (3) using the coefficient K ($=1.260$) in the case of halogen lamps.

$$Ls = \frac{1}{2.3}\int_{380}^{780} S(\lambda)\{1.260 \times Gs(\lambda) + V(\lambda)\}d\lambda \tag{5}$$

The first luminance ratio Ls/L of light emitted by the light emitting device is a ratio of the first effective radiance Ls of light emitted by the light emitting device in consideration of the spectral luminous efficiency curve for photopic vision of humans specified by the CIE and the S-cone spectral sen-sitivity of humans, to the luminance L of light emitted by the light emitting device in consideration of the spectral lumi-nous efficiency curve for photopic vision of humans speci-fied by the CIE. The first luminance ratio Ls/L represents the degree of glare reduction of light emitted by the light emitting device.

The light emitting device according to the first embodi-ment includes a light emitting element having a light emis-sion peak wavelength in a range of 400 nm or more and 490 nm or less, a first fluorescent material having a light emis-sion peak wavelength in a range of 480 nm or more and less than 580 nm, and a second fluorescent material having a light emission peak wavelength in a range of 580 nm or more and 680 nm or less and having a composition different from that of the first fluorescent material. The light emitting device emits light having a first luminance ratio Ls/L of 0.9 or less derived from the following formula (1).

$$Ls/L = \frac{\int_{380}^{780} S(\lambda)\{1.260 \times Gs(\lambda) + V(\lambda)\}d\lambda}{2.3\int_{380}^{780} S(\lambda) \times V(\lambda)d\lambda} \tag{1}$$

wherein $S (\lambda)$ represents a spectral radiance of light emitted by the light emitting device, $V (\lambda)$ represents a spectral luminous efficiency curve for photopic vision of humans specified by the CIE, and $Gs (\lambda)$ represents an S-cone spectral sensitivity of humans in a wave-length ($\lambda$ nm) range of 380 nm or more and 550 nm or less.

When the first luminance ratio Ls/L of light emitted by the light emitting device is 0.9 or less, the light emitting device is capable of emitting light with reduced glare. When the first luminance ratio Ls/L of light emitted by the light emitting device is more than 0.9, the luminance is close to the luminance L of light emitted by the light emitting device without considering the S-cone spectral sensitivity of humans, and glare is not reduced. In order to reduce glare that humans feel uncomfortable, the first luminance ratio Ls/L of light emitted by the light emitting device is preferably 0.85 or less, more preferably 0.83 or less, and even more preferably 0.80 or less. Considering the S-cone spectral sensitivity of humans, the first luminance ratio Ls/L of light emitted by the light emitting device may be 0.1 or more, and may be 0.2 or more.

The light emitting device that emits light having a first luminance ratio Ls/L of 0.9 or less preferably emits light having a second luminance ratio B/A of 0.104 or less described below. The light emitting device that emits light having a first luminance ratio Ls/L of 0.9 or less and a second luminance ratio B/A of 0.104 or less described below enables light to reach a long distance while reducing glare.

The light emitting device according to the second embodiment includes a light emitting element having a light emission peak wavelength in a range of 440 nm or more and 490 nm or less, a first fluorescent material having a light emission peak wavelength in a range of 480 nm or more and less than 580 nm, and a second fluorescent material having a light emission peak wavelength in a range of 580 nm or more and 680 nm or less and having a composition different from that of the first fluorescent material. The light emitting device emits light having a second luminance ratio B/A of 0.104 or less derived from the following formula (2), which is a ratio of the second effective radiance B of light emitted by the light emitting device in a range of 300 nm or more and 800 nm or less in consideration of the scattering intensity curve for wavelengths when the scattering intensity of Rayleigh scattering at a wavelength of 300 nm is 1, to the radiance A of light emitted by the light emitting device in a range of 300 nm or more and 800 nm or less.

$$B/A = \frac{\int_{300}^{800} Dc(\lambda) \times S(\lambda)d\lambda}{\int_{300}^{800} S(\lambda)d\lambda} \qquad (2)$$

wherein S ($\lambda$) represents a spectral radiance of light emitted by the light emitting device and Dc ($\lambda$) represents a scattering intensity curve for wavelengths when the scattering intensity of Rayleigh scattering at a wavelength of 300 nm is 1 in Rayleigh scattering.

Scattering of light caused by the interaction of light and fine particles is determined by the relative relationship between the wavelength $\lambda$ of light and the size D of fine particles. The size D of fine particles contained in the air is much smaller than the wavelength $\lambda$ of light. Rayleigh scattering is the scattering of light caused by particles that are smaller in size than the wavelength of the light. In the air, the shorter the wavelength of light, the more easily the light is scattered. Suppression of light scattering enables light to reach a long distance. Light emitting devices that enable light to reach a long distance can be suitably used for high-beam mode headlights that illuminate a relatively distant area, such as approximately 100 m ahead. The light emitting device according to the second embodiment suppresses scattering and enables the light to reach a relatively long distance. A headlight using the light emitting device according to the second embodiment and a vehicle including the headlight enable light to reach a relatively long distance.

The radiance A of light emitted by the light emitting device is derived by the following formula (6). The radiance A of light emitted by the light emitting device is an integrated value of the spectral radiance S ($\lambda$) of the light emitting device in a range of 300 nm or more and 800 nm or less.

$$A = \int_{300}^{800} S(\lambda)d\lambda \qquad (6)$$

FIG. 2 shows a scattering intensity curve Dc ($\lambda$) for wavelengths when the scattering intensity of Rayleigh scattering at a wavelength of 300 nm is 1.

The second effective radiance B of light emitted by the light emitting device is derived by the following formula (7). The second effective radiance B of light emitted by the light emitting device is an integral value of the scattering intensity curve Dc ($\lambda$) and the spectral radiance S ($\lambda$) of the light emitting device in a range of 300 nm or more and 800 nm or less.

$$A = \int_{300}^{800} Dc(\lambda) \times S(\lambda)d\lambda \qquad (7)$$

The second luminance ratio B/A of light emitted by the light emitting device is a ratio of the second effective radiance B of light emitted by the light emitting device in a range of 300 nm or more and 800 nm or less in consideration of the scattering intensity curve for wavelengths when the scattering intensity of Rayleigh scattering at a wavelength of 300 nm is 1, to the radiance A of light emitted by the light emitting device in a range of 300 nm or more and 800 nm or less. The second luminance ratio B/A represents the degree of scattering of light emitted by the light emitting device.

When the second luminance ratio B/A of light emitted by the light emitting device is 0.104 or less, the light emitting device is capable of emitting light that is suppressed in scattering and reaches a relatively long distance. When the second luminance ratio B/A of light emitted by the light emitting device is more than 0.104, the luminance is close to the radiance A of light emitted by the light emitting device without considering Rayleigh scattering. In order to emit light that is suppressed in scattering and reaches a relatively long distance, the second luminance ratio B/A of light emitted by the light emitting device is preferably 0.102 or less, more preferably 0.100 or less, even more preferably 0.099 or less, and still more preferably 0.098 or less. Considering Rayleigh scattering, the second luminance ratio B/A of light emitted by the light emitting device may be 0.01 or more, and may be 0.02 or more.

The light emitting device that emits light having a second luminance ratio B/A of 0.104 or less preferably emits light having a first luminance ratio Ls/L of 0.9 or less described above. The light emitting device that emits light having a second luminance ratio B/A of 0.104 or less and a first luminance ratio Ls/L of 0.9 or less enables light to reach a relatively long distance and also reduces glare.

The following describes a light emitting device that emits light having a first luminance ratio Ls/L of 0.9 or less and/or a light emitting device that emits light having a second luminance ratio B/A of 0.104 or less. The light emitting device that emits light having a first luminance ratio Ls/L of 0.9 or less and the light emitting device that emits light having a second luminance ratio B/A of 0.104 or less preferably have the same range of correlated color temperatures, and they may be light emitting devices of the same embodiment using the same members.

The light emitting device preferably emits light having a correlated color temperature of 1,800 K or more and 5,000 K or less, more preferably 2,000 K or more and 5,000 K or less. A lower correlated color temperature of light emitted by the light emitting device included in, for example, a vehicle headlight reduces glare that is perceived as dazzling by people such as drivers of preceding vehicles, oncoming vehicles, and the driving vehicle itself.

Light Emitting Element

The light emitting element has a light emission peak wavelength in a range of 400 nm or more and 490 nm or less. The light emission peak wavelength of the light emitting element is preferably in a range of 420 nm or more and 480 nm or less, and may be in a range of 440 nm or more and 460 nm or less. Since at least a part of the light emitted by the light emitting element is used as excitation light for a first fluorescent material and a second fluorescent material, it is preferable to have a light emission peak wavelength that easily excites these fluorescent materials. The full width at half maximum of the light emission spectrum in the light emitting element is preferably 30 nm or less, more preferably 25 nm or less, and even more preferably 20 nm or less. The light emitting element preferably uses, for example, a semiconductor light emitting element using a nitride-based semiconductor. With this configuration, a stable light emitting device having high efficiency, high linearity of output to input, and high resistance to mechanical impact, can be obtained.

First Fluorescent Material

The first fluorescent material is excited by light emitted by the light emitting element having a light emission peak wavelength in a range of 400 nm or more and 490 nm or less to emit light having a light emission peak wavelength in a range of 480 nm or more and less than 580 nm. The first fluorescent material preferably has a full width at half maximum of the light emission spectrum in a range of 90 nm or more and 125 nm or less; and the full width at half maximum may be in a range of 100 nm or more and 124 nm or less, and may be in a range of 110 nm or more and 123 nm or less. When the first fluorescent material has a light emission peak wavelength in the range of 480 nm or more and less than 580 nm, the excitation light emitted by the light emitting element is wavelength-converted, and the light emitting device emits mixed color light of the light emitted by the light emitting element and the light of which the wavelength is converted by the first fluorescent material and the second fluorescent material.

The first fluorescent material preferably contains at least one selected from the group consisting of a rare earth aluminate fluorescent material having a composition included in a compositional formula represented by the following formula (1A) and a first nitride fluorescent material having a composition included in a compositional formula represented by the following formula (1B).

$$Ln^1_3(Al_{1-a}Ga_a)_5O_{12}:Ce \qquad (1A)$$

10 wherein $Ln^1$ includes at least one element selected from the group consisting of Y, Gd, Tb, and Lu, and a satisfies $0 \le a \le 0.5$; and $$La_wLn^2_xSi_6N_y:Ce_z \qquad (1B)$$

wherein $Ln^2$ includes at least one selected from the group consisting of Y and Gd as an essential component, and may include at least one selected from the group consisting of Sc and Lu, the total of Y and Gd included in $Ln^2$ is 90 mol % or more when the $Ln^2$ elements included in 1 mol of the composition is 100 mol %, and w, x, y, and z each satisfy $1.2 \le w \le 2.2$, $0.5 \le x \le 1.2$, $10 \le y \le 12$, $0.5 \le z \le 1.2$, $1.80 < w+x < 2.40$, and $2.9 \le w+x+z \le 3.1$.

In the present specification, in the formula representing the composition of the fluorescent material, the part before the colon (:) represents a host crystal and the molar ratio of each element in 1 mol of the composition of the fluorescent material, and the part after the colon (:) represents an activating element.

The first fluorescent material may contain at least one fluorescent material selected from the group consisting of an alkaline earth metal aluminate fluorescent material and an alkaline earth metal halosilicate fluorescent material. The alkaline earth metal aluminate fluorescent material is, for example, a fluorescent material containing at least strontium and activated with europium, and has a composition included in a compositional formula represented by, for example, the following formula (1C). The alkaline earth metal halosilicate fluorescent material is, for example, a fluorescent material containing at least calcium and chlorine and activated with europium, and has a composition included in a compositional formula represented by, for example, the following formula (1D).

$$Sr_4Al_{14}O_{25}:Eu \qquad (1C)$$

$$(Ca,Sr,Ba)_8MgSi_4O_{16}(F,Cl,Br)_2:Eu \qquad (1D)$$

In the formula (1C), a part of Sr may be substituted with at least one element selected from the group consisting of Mg, Ca, Ba, and Zn.

The alkaline earth metal aluminate fluorescent material having a composition included in a compositional formula represented by the formula (1C) and the alkaline earth metal halosilicate fluorescent material having a composition included in a compositional formula represented by the formula (1D) have a light emission peak wavelength in a range of 480 nm or more and less than 520 nm, preferably in a range of 485 nm or more and 515 nm or less.

The alkaline earth metal aluminate fluorescent material having a composition included in a compositional formula represented by the formula (1C) and the alkaline earth metal halosilicate fluorescent material having a composition included in a compositional formula represented by the formula (1D) have a full width at half maximum of, for example, 30 nm or more, preferably 40 nm or more, and more preferably 50 nm or more; and, for example, 80 nm or less, preferably 70 nm or less in the light emission spectrum.

In the present specification, plural elements sectioned by commas (,) in the formula representing the composition of a fluorescent material mean that at least one of these plural elements is contained in the composition, and a combination of two or more of these plural elements may be contained.

The first fluorescent material may contain at least one fluorescent material selected from the group consisting of a β-SiAlON fluorescent material, a first sulfide fluorescent material, a scandium-based fluorescent material, an alkaline earth metal silicate fluorescent material, and a lanthanide-based nitride fluorescent material. The β-SiAlON fluorescent material has a composition included in a compositional formula represented by, for example, the following formula (1E). The first sulfide fluorescent material has a composition included in a compositional formula represented by, for example, the following formula (1F). The scandium-based fluorescent material has a composition included in a compositional formula represented by, for example, the following formula (1G). The alkaline earth metal silicate fluorescent material has a composition included in a compositional formula represented by, for example, the following formula (1H) or a composition included in a compositional formula represented by, for example, the following formula (1J). The lanthanide-based nitride fluorescent material has a composition included in a compositional formula represented by, for example, the following formula (1K).

$$Si_{6-g}Al_gO_gN_{8-g}:Eu \quad (0 < g \leq 4.2) \tag{1E}$$

$$(Sr,M^3)Ga_2S_4:Eu \tag{1F}$$

wherein $M^3$ represents at least one element selected from the group consisting of Be, Mg, Ca, Ba, and Zn.

$$(Ca,Sr)Sc_2O_4:Ce \tag{1G}$$

$$(Ca,Sr)_3(Sc,Mg)_2Si_3O_{12}:Ce \tag{1H}$$

$$(Ca,Sr,Ba)_2SiO_4:Eu \tag{1J}$$

$$(La,Y,Gd,Lu)_3Si_6N_{11}:Ce \tag{1K}$$

The β-SiAlON fluorescent material, the first sulfide fluorescent material, the scandium-based fluorescent material, the alkaline earth metal silicate fluorescent material, and the lanthanide-based nitride fluorescent material each have a light emission peak wavelength in a range of 520 nm or more and less than 580 nm, preferably in a range of 525 nm or more and 565 nm or less. The β-SiAlON fluorescent material, the first sulfide fluorescent material, the scandium-based fluorescent material, the alkaline earth metal silicate fluorescent material, and the lanthanide-based nitride fluorescent material each have a full width at half maximum of, for example, 20 nm or more, preferably 30 nm or more; and, for example, 120 nm or less, preferably 115 nm or less in the light emission spectrum.

The first fluorescent material may contain at least one fluorescent material selected from the group consisting of a rare earth aluminate fluorescent material having a composition included in a compositional formula represented by the formula (1A), a first nitride fluorescent material having a composition included in a compositional formula represented by the formula (1B), an alkaline earth metal aluminate fluorescent material having a composition included in a compositional formula represented by the formula (1C), an alkaline earth metal halosilicate fluorescent material having a composition included in a compositional formula represented by the formula (1D), a β-SiAlON fluorescent material having a composition included in a compositional formula represented by the formula (1E), a first sulfide fluorescent material having a composition included in a compositional formula represented by the formula (1F), a scandium-based fluorescent material having a composition included in a compositional formula represented by the formula (1G), an alkaline earth metal silicate fluorescent material having a composition included in a compositional formula represented by the formula (1H), an alkaline earth metal silicate fluorescent material having a composition included in a compositional formula represented by the formula (1J), and a lanthanide-based nitride fluorescent material having a composition included in a compositional formula represented by the formula (1K). The first fluorescent material may contain at least one fluorescent material alone, and may contain two or more of these.

Second Fluorescent Material

The second fluorescent material is excited by light emitted by the light emitting element having a light emission peak wavelength in a range of 400 nm or more and 490 nm or less to emit light having a light emission peak wavelength in a range of 580 nm or more and 680 nm or less, and has a composition different from that of the first fluorescent material. The second fluorescent material preferably has a full width at half maximum in a range of 3 nm or more and 15 nm or less in the light emission spectrum. Such a second fluorescent material preferably contains, for example, a fluoride fluorescent material having a composition included in a compositional formula represented by the following formula (2C) or a fluoride fluorescent material having a composition included in a compositional formula represented by the following formula (2C'). Alternatively, the second fluorescent material preferably has a full width at half maximum in a range of 60 nm or more and 125 nm or less in the light emission spectrum. Such a second fluorescent material preferably contains, for example, a second nitride fluorescent material having a composition included in a compositional formula represented by the following formula (2A), a third nitride fluorescent material having a composition included in a compositional formula represented by the following formula (2B), or an α-SiAlON fluorescent material having a composition included in a compositional formula represented by the following formula (2G). With the second fluorescent material, the excitation light emitted by the light emitting element is wavelength-converted, and the light emitting device emits mixed color light of the light emitted by the light emitting element and the light of which the wavelength is converted by the first fluorescent material and the second fluorescent material.

The second fluorescent material preferably contains at least one selected from the group consisting of a second nitride fluorescent material having a composition included in a compositional formula represented by the following formula (2A), a third nitride fluorescent material having a composition included in a compositional formula represented by the following formula (2B), a fluoride fluorescent material having a composition included in a compositional formula represented by the following formula (2C), a fluoride fluorescent material having a composition included in a compositional formula represented by the following formula (2C'), which is different in composition from the following formula (2C), and an α-SiAlON fluorescent material having a composition included in a compositional formula represented by the following formula (2G). In the present specification, the second nitride fluorescent material having a composition included in a compositional formula represented by the following formula (2A) may be referred to as a BSESN fluorescent material, and the third nitride fluorescent material having a composition included in a compositional formula represented by the following formula (2B) may be referred to as a SCASN fluorescent material.

$$M^1_2Si_5N_8:Eu \tag{2A}$$

wherein $M^1$ represents an alkaline earth metal element containing at least one selected from the group consisting of Ca, Sr, and Ba.

$$Sr_qCa_sAl_tSi_uN_v:Eu \tag{2B}$$

wherein q, s, t, u, and v each satisfy $0 \leq q < 1$, $0 < s \leq 1$, $q+s \leq 1$, $0.9 \leq t \leq 1.1$, $0.9 \leq u \leq 1.1$, and $2.5 \leq v \leq 3.5$.

$$A_c[M^2_{1-b}Mn^{4+}_bF_d] \tag{2C}$$

wherein A includes at least one selected from the group consisting of $K^+$, $Li^+$, $Na^+$, $Rb^+$, $Cs^+$, and $NH_4^+$, of which $K^+$ is preferred; $M^2$ includes at least one element selected from the group consisting of Group 4 elements and Group 14 elements, of which Si and Ge are preferred; b satisfies $0 < b < 0.2$; c represents an absolute value of the charge of $[M^2_{1-b}Mn^{4+}_bF_d]$ ions; and d satisfies $5 < d < 7$.

$$A'_{c'}[M^{2'}_{1-b'}Mn^{4+}_{b'}F_{d'}] \tag{2C'}$$

wherein A' includes at least one selected from the group consisting of $K^+$, $Li^+$, $Na^+$, $Rb^+$, $Cs^+$, and $NH_4^+$, of which $K^+$ is preferred; $M^{2'}$ includes at least one element selected from the group consisting of Group 4 elements, Group 13 elements, and Group 14 elements, of which Si and Al are preferred; b' satisfies $0 < b' < 0.2$; c' represents an absolute value of the charge of $[M^{2'}_{1-b'}Mn^{4+}_{b'}F_{d'}]$ ions; and d' satisfies $5 < d' < 7$.

$$M^8_{v3}Si_{12-(w3+x3)}Al_{w3+x3}O_{x3}N_{16-x3}:Eu \tag{2G}$$

wherein $M^8$ includes at least one element selected from the group consisting of Li, Mg, Ca, Sr, Y, and lanthanoid elements (excluding La and Ce); and v3, w3, and x3 each satisfy $0 < v3 \leq 2.0$, $2.0 \leq w3 \leq 6.0$, and $0 \leq x3 \leq 1.0$.

The second fluorescent material may contain at least one fluorescent material selected from the group consisting of a fluorogermanate fluorescent material, a fourth nitride fluorescent material, and a second sulfide fluorescent material. The fluorogermanate fluorescent material has a composition included in a compositional formula represented by, for example, the following formula (2D). The fourth nitride fluorescent material has a composition included in a compositional formula represented by, for example, the following formula (2E). The second sulfide fluorescent material has a composition included in a compositional formula represented by, for example, the following formula (2F).

$$(i-j)MgO \cdot (j/2)Sc_2O_3 \cdot kMgF_2 \cdot mCaF_2 \cdot (1-n)Geo_2 \cdot (n/2)M^4_2O_3:Mn \tag{2D}$$

wherein $M^4$ represents at least one selected from the group consisting of Al, Ga, and In; and i, j, k, m, and n each satisfy $2 \leq i \leq 4$, $0 \leq j < 0.5$, $0 < k < 1.5$, $0 \leq m < 1.5$, and $0 \leq n < 0.5$.

$$M^5_{v2}M^6_{w2}Al_{3-y2}Si_{y2}N_{z2}:M^7 \tag{2E}$$

wherein $M^5$ represents at least one element selected from the group consisting of Ca, Sr, Ba, and Mg; $M^6$ represents at least one element selected from the group consisting of Li, Na, and K; $M^7$ represents at least one element selected from the group consisting of Eu, Ce, Tb, and Mn; and v2, w2, y2, and z2 each satisfy $0.80 \leq v2 \leq 1.05$, $0.80 \leq w2 \leq 1.05$, $0 \leq y2 \leq 0.5$, and $3.0 \leq z2 \leq 5.0$.

$$(Ca,Sr)S:Eu \tag{2F}$$

The fluorogermanate fluorescent material having a composition included in a compositional formula represented by the formula (2D) may have a composition represented by the following formula (2d).

$$3.5MgO \cdot 0.5MgF_2 \cdot GeO_2:Mn \tag{2d}$$

The fourth nitride fluorescent material having a composition included in a compositional formula represented by the formula (2E) may have a composition included in a compositional formula represented by the following formula (2e).

$$M^5_{v2}M^6_{w2}M^7_{x2}Al_{3-y2}Si_{y2}N_{z2} \tag{2e}$$

wherein $M^5$, $M^6$, and $M^7$ are synonymous with $M^5$, $M^6$, and $M^7$ in the formula (2E), respectively, and are at least one element selected from the group consisting of Ce, Tb, and Mn; v2, w2, y2, and z2 are synonymous with v2, w2, y2, and z2 in the formula (2E), respectively; and x2 satisfies $0.001 < x2 \leq 0.1$.

The fluorogermanate fluorescent material, the fourth nitride fluorescent material, and the second sulfide fluorescent material each have a light emission peak wavelength in a range of 580 nm or more and 680 nm or less, preferably in a range of 600 nm or more and 630 nm or less. The fluorogermanate fluorescent material, the fourth nitride fluorescent material, and the second sulfide fluorescent material each have a full width at half maximum of, for example, 5 nm or more and 100 nm or less, preferably 6 nm or more and 90 nm or less in the light emission spectrum.

The second fluorescent material preferably contains at least one selected from the group consisting of a second nitride fluorescent material having a composition included in a compositional formula represented by the formula (2A), a third nitride fluorescent material having a composition included in a compositional formula represented by the formula (2B), a fluoride fluorescent material having a composition included in a compositional formula represented by the formula (2C), a fluoride fluorescent material represented by the formula (2C'), a fluorogermanate fluorescent material having a composition included in a compositional formula represented by the formula (2D), a fourth nitride fluorescent material having a composition included in a compositional formula represented by the formula (2E), a second sulfide fluorescent material having a composition included in a compositional formula represented by the formula (2F), and an α-SiAlON fluorescent material having a composition included in a compositional formula represented by the formula (2G). The second fluorescent material may contain at least one fluorescent material alone, and may contain two or more of these.

It is further preferred for the second fluorescent material to contain at least one selected from the group consisting of a second nitride fluorescent material (BSESN fluorescent material) having a composition included in a compositional formula represented by the formula (2A), a third nitride fluorescent material (SCASN fluorescent material) having a composition included in a compositional formula represented by the formula (2B), and an α-SiAlON fluorescent material having a composition included in a compositional formula represented by the formula (2G). At least one second fluorescent material selected from the group consisting of the BSESN fluorescent material, the SCASN fluorescent material, and the α-SiAlON fluorescent material has good temperature characteristics and little change in light emission energy due to changes in temperature. For example, a light emitting device including a wavelength conversion member containing, as a first fluorescent material, a rare earth aluminate fluorescent material having a composition included in a compositional formula represented by the formula (1A) and, as a second fluorescent material, at least one selected from the group consisting of the BSESN fluorescent material, the SCASN fluorescent material, and the α-SiAlON fluorescent material, has good temperature characteristics of the first fluorescent material and the second fluorescent material. Therefore, even when the light emitting device is used in, for example, a cold atmosphere of –40° C. or in a hot temperature atmosphere of higher than 100° C., the light emitting device has a small change rate of the first luminance ratio Ls/L while the first luminance ratio Ls/L is maintained at 0.9 or less, is not easily affected by the ambient temperature of the use environment, and emits light with reduced glare. Even when the temperature of the use environment of the light emitting device changes while the first luminance ratio Ls/L is maintained at 0.9 or less, the light emitting device capable of emitting light with a small change rate of the first luminance ratio Ls/L may have good temperature characteristics.

The light emitting device including a wavelength conversion member containing, as a first fluorescent material, a rare earth aluminate fluorescent material having a composition included in a compositional formula represented by the formula (1A) and, as a second fluorescent material, at least one selected from the group consisting of the BSESN fluorescent material, the SCASN fluorescent material, and the α-SiAlON fluorescent material, has good temperature characteristics of the first fluorescent material and the second fluorescent material. Therefore, the light emitting device has a small change rate of the second luminance ratio B/A while the second luminance ratio B/A is maintained at 0.104 or less, is not easily affected by the ambient temperature of the use environment, and emits light that is suppressed in scattering and reaches a relatively long distance. Even when the temperature of the use environment of the light emitting device changes while the second luminance ratio B/A is maintained at 0.104 or less, the light emitting device capable of emitting light with a small change rate of the second luminance ratio B/A may have good temperature characteristics.

The fluorescent materials including the first fluorescent material and the second fluorescent material preferably have an average particle diameter, as measured according to a Fisher Sub-Sieve Sizer (hereinafter also referred to as "FSSS") method, in a range of 5 μm or more and 40 μm or less, more preferably in a range of 6 μm or more and 35 μm or less, and even more preferably in a range of 7 μm or more and 30 μm or less. When the average particle diameter of the fluorescent material falls within the range of 5 μm or more and 40 μm or less, light emitted by the excitation light source is efficiently absorbed by the fluorescent material and wavelength-converted, so that the light emitting device emits light with reduced glare or light that is suppressed in light scattering and reaches a relatively long distance.

The light emitting device preferably emits light having a correlated color temperature of 1,800 K or more and less than 3,500 K, wherein the content of the first fluorescent material is in a range of 5% by mass or more and 93% by mass or less relative to the total amount of the first fluorescent material and the second fluorescent material. When the correlated color temperature of the light falls within the range of 1,800 K or more and less than 3,500 K, the light emitting device emits light having a low correlated color temperature with a reduced blue light component to reduce glare. When the content of the first fluorescent material falls within the range of 5% by mass or more and 93% by mass or less relative to the total amount of the first fluorescent material and the second fluorescent material, the light emitting device emits light having a correlated color temperature of 1,800 K or more and less than 3,500 K and a first luminance ratio Ls/L of 0.9 or less. The content of the first fluorescent material is more preferably in a range of 10% by mass or more and 92% by mass or less, even more preferably in a range of 15% by mass or more and 90% by mass or less, particularly preferably in a range of 20% by mass or more and 88% by mass or less, may be in a range of 30% by mass or more and 85% by mass or less, may be 40% by mass or more, and may be 50% by mass or more, relative to the total amount of the first fluorescent material and the second fluorescent material.

The light emitting device preferably emits light having a correlated color temperature of 3,500 K or more and less than 4,000 K, wherein the content of the first fluorescent material is in a range of 20% by mass or more and 95% by mass or less relative to the total amount of the first fluorescent material and the second fluorescent material. When the correlated color temperature of the light falls within the range of 3,500 K or more and less than 4,000 K, the light emitting device emits light having a low correlated color temperature with a reduced blue light component to reduce glare. When the content of the first fluorescent material falls within the range of 20% by mass or more and 95% by mass or less relative to the total amount of the first fluorescent material and the second fluorescent material, the light emitting device emits light having a correlated color temperature of 3,500 K or more and less than 4,000 K and a first luminance ratio Ls/L of 0.9 or less. The content of the first fluorescent material is more preferably in a range of 30% by mass or more and 90% by mass or less, even more preferably in a range of 40% by mass or more and 85% by mass or less, may be 50% by mass or more, may be 60% by mass or more, may be 70% by mass or more, and may be 75% by mass or more, relative to the total amount of the first fluorescent material and the second fluorescent material.

The light emitting device preferably emits light having a correlated color temperature of 4,000 K or more and 5,000 K or less, wherein the content of the first fluorescent material is in a range of 50% by mass or more and 99% by mass or less relative to the total amount of the first fluorescent material and the second fluorescent material. When the correlated color temperature of the light falls within the range of 4,000 K or more and 5,000 K or less, the light emitting device emits light having a relatively low correlated color temperature with a relatively reduced blue light component to reduce glare. When the content of the first fluorescent material falls within the range of 50% by mass or more and 99% by mass or less relative to the total amount of the first fluorescent material and the second fluorescent material, the light emitting device emits light having a correlated color temperature of 4,000 K or more and 5,000 K or less and a first luminance ratio Ls/L of 0.9 or less. The content of the first fluorescent material is more preferably in a range of 60% by mass or more and 98% by mass or less, even more preferably in a range of 70% by mass or more and 95% by mass or less, and may be 75% by mass or more, relative to the total amount of the first fluorescent material and the second fluorescent material.

Light Emitting Device

The following describes a form of the light emitting device. FIG. 3A shows an exemplary light emitting device, which is a schematic plan view of a light emitting device 101. FIG. 3B is a schematic cross-sectional view of the III-III' line of the light emitting device 101 shown in FIG. 3A. The light emitting device 101 includes a light emitting element 10 having a light emission peak wavelength in a range of 400 nm or more and 490 nm or less, and a wavelength conversion member 40 including a wavelength conversion body 41 containing a first fluorescent material 71 and a second fluorescent material 72 that are excited by light emitted by the light emitting element 10 and emit light, and a transparent body 42 on which the wavelength conversion body 41 is arranged. The light emitting element 10 is flip-chip mounted on a substrate 1 via bumps that are conductive members 60. The wavelength conversion body 41 of the wavelength conversion member 40 is arranged on the light emitting surface of the light emitting element 10 via an adhesive layer 80. The side surfaces of the light emitting element 10 and the wavelength conversion member 40 are covered with a covering member 90 that reflects light. The wavelength conversion body 41 includes a first fluorescent material 71 having a light emission peak wavelength in a range of 480 nm or more and less than 580 nm, and a second fluorescent material 72 having a light emission peak wavelength in a range of 580 nm or more and 680 nm or less and having a composition different from that of the first fluorescent material 71, which are excited by light emitted by the light emitting element 10. The light emitting element 10 receives electric power from the outside of the light emitting device 101 via the wiring and the conductive members 60 formed on the substrate 1, thereby enabling the light emitting device 101 to emit light. The light emitting device 101 may include a semiconductor element 50 such as a protective element, for preventing the light emitting element 10 from being destroyed by applying an excessive voltage. The covering member 90 is provided so as to cover, for example, the semiconductor element 50. The following describes each member used in the light emitting device. For the details, for example, the disclosure of Japanese Unexamined Patent Publication No. 2014-112635 may be referred to.

Wavelength Conversion Member

The wavelength conversion member may be a wavelength conversion body containing a fluorescent material and a transparent material, or may be a wavelength conversion member including a transparent body on which the wavelength conversion body is arranged. The wavelength conversion body preferably contains a first fluorescent material, a second fluorescent material, and a transparent material. The wavelength conversion body may be formed into a plate shape, a sheet shape, or a layered shape. The wavelength conversion member may include a wavelength conversion body in a shape other than a plate shape, a sheet shape, or a layered shape. The total amount of the fluorescent materials contained in the wavelength conversion member or the wavelength conversion body may be in a range of 1 part by mass or more and 900 parts by mass or less, may be in a range of 10 parts by mass or more and 850 parts by mass or less, and may be in a range of 15 parts by mass or more and 800 parts by mass or less, relative to 100 parts by mass of the transparent material. The total amount of the fluorescent materials refers to the total amount of the first fluorescent material and the second fluorescent material.

The wavelength conversion body preferably includes a high-concentration layer having a high filling ratio of the first fluorescent material and the second fluorescent material and having high concentrations of the first fluorescent material and the second fluorescent material, and a low-concentration layer having a low filling ratio of the first fluorescent material and the second fluorescent material and having low concentrations of the first fluorescent material and the second fluorescent material, in the cross-sectional thickness direction. By including the high-concentration layer having a high filling ratio of the first fluorescent material and the second fluorescent material in the wavelength conversion body, the wavelength conversion body is less likely to break or crack. In the wavelength conversion body, the high-concentration layer is preferably arranged on the light emitting element side. By arranging the high-concentration layer on the light emitting element side, the wavelength conversion body may radiate heat generated by the light emitting element through the first fluorescent material and the second fluorescent material in the wavelength conversion body. The filling ratio of the fluorescent materials can be measured from the area ratio of the resin to the fluorescent materials in the cross section of the wavelength conversion body or the wavelength conversion member observed using a scanning electron microscope (SEM). The high-concentration layer having a high filling ratio of the fluorescent materials is a layer in which the area of the fluorescent materials is larger than that of the resin in the cross section of the wavelength conversion body or the wavelength conversion member. The low-concentration layer having a low filling ratio of the fluorescent materials is a layer in which the area of the fluorescent materials is smaller than that of the resin in the cross section of the wavelength conversion body or the wavelength conversion member. The low-concentration layer may be a layer in which the fluorescent materials are substantially absent, no fluorescent material area is observed, and only the resin area can be confirmed. As for the ratio of the thickness of the high-concentration layer and the thickness of the low-concentration layer in the cross section of the wavelength conversion body observed using an SEM, the thickness of the low-concentration layer may be 40% or less, may be 35% or less, and may be 34% or less; and may be 3% or more, and may be 5% or more, when the total thickness of the wavelength conversion body is 100%. A large ratio of the thickness of the low-concentration layer represents a small ratio of the thickness of the high-concentration layer, a high filling ratio of the first fluorescent material and the second fluorescent material contained in the high-concentration layer, and a high density of the high-concentration layer. In order to suppress breakage or cracking of the wavelength conversion body and to achieve high heat radiation, it is preferable that the filling ratio of the first fluorescent material and the second fluorescent material contained in the high-concentration layer is high, and the density of the first fluorescent material and the second fluorescent material is high.

FIG. 3C is a partially enlarged view P1 of the schematic cross section of the light emitting device shown in FIG. 3B. For the purpose of explanation, FIG. 3C may differ in scale from FIG. 3B.

The wavelength conversion body 41 includes a high-concentration layer 41a having a high filling ratio of the first fluorescent material 71 and the second fluorescent material 72, and a low-concentration layer 41b having a low filling ratio of the first fluorescent material 71 and the second fluorescent material 72, wherein the high-concentration layer 41a is arranged on the side of the light emitting element 10. The low-concentration layer 41b in the wavelength conversion body 41 is arranged on the side of the transparent body 42. The wavelength conversion body 41 is arranged on the light emitting surface of the light emitting element 10 via the adhesive layer 80.

Since high-output light emitting devices have been used for headlights, wavelength conversion members in which a resin composition containing a fluorescent material is coated on a transparent body made of glass having high heat resistance, or wavelength conversion members having high heat resistance, such as a sintered body containing a fluorescent material and a transparent material, may be used. For the fluorescent material contained in the wavelength conversion members having high heat resistance, a fluorescent material considered to have relatively high heat resistance compared to other fluorescent materials, such as a rare earth aluminate fluorescent material having a composition represented by $Y_3Al_5O_{12}$:Ce, may also be used. Since the rare earth aluminate fluorescent material has a relatively low light emission intensity on the long-wavelength side, such as 570 nm or more, it is usually considered to emit light having a correlated color temperature of around 6,000 K when used in in headlights. Therefore, when the fluorescent material contained in the wavelength conversion member is composed only of, for example, a rare earth aluminate fluorescent material having a composition represented by $Y_3Al_5O_{12}$:Ce, it is considered difficult to realize a headlight capable of emitting light having a correlated color temperature of 5,000 K or less. The light emitting device according to the first embodiment or the second embodiment may contain, as a fluorescent material contained in a sintered body used in the wavelength conversion member, one type of the aforementioned first and second fluorescent materials alone, or may contain two or more types of the aforementioned first and second fluorescent materials. Examples of the fluorescent material contained in the sintered body include the following fluorescent materials.

$(Ba,Sr,Ca)_2Si_5N_8$:Eu    $(La,Y,Gd,Lu)_3Si_6N_{11}$:Ce    $(Ca,Sr)AlSiN_3$:Eu

For the sintered body used in the wavelength conversion member, a single sintered body containing, for example, a rare earth aluminate fluorescent material and a second nitride fluorescent material may be used, or a sintered body containing a rare earth aluminate fluorescent material and a sintered body containing a second nitride fluorescent material may be combined in two layers.

The wavelength conversion body used in the wavelength conversion member, when glass is used as a transparent material, may be, for example, a wavelength conversion body containing glass and an $\alpha$-SiAlON fluorescent material having a compositional formula represented by $M^8_{v3}(Si,Al)_{12}(O,N)_{16}$:Eu (wherein $M^8$ represents lanthanide elements excluding Li, Mg, Ca, Y, La, and Ce, and v3 satisfies $0 < v3 \leq 2$).

By using the above for the wavelength conversion member, it is considered that the light emitting device emits light having a correlated color temperature of 5,000 K or less, and the light emitting device can be used to provide a headlight capable of reducing glare and a vehicle including the same.

Transparent Material

Examples of the transparent material include at least one selected from the group consisting of a resin, glass, and an inorganic substance. The resin is preferably at least one selected from the group consisting of an epoxy resin, a silicone resin, a phenol resin, and a polyimide resin. Examples of the inorganic substance include at least one selected from the group consisting of aluminum oxide and aluminum nitride.

When the transparent material is a resin, the resin preferably has a Shore A hardness in a range of 30 or more and 80 or less. The transparent material is preferably a silicone resin, more preferably a silicone resin having a Shore A hardness in a range of 30 or more and 80 or less. The Shore A hardness of the silicone resin, which is the transparent material, is more preferably in a range of 40 or more and 75 or less, even more preferably in a range of 50 or more and 70 or less. When the transparent material is a resin, the resin expands or contracts when exposed to light or heat. When the transparent material is a silicone resin having a Shore A hardness of 30 or more and 80 or less, it has excellent toughness and elongation. Therefore, even when the environmental ambient temperature changes, the transparent material flexibly expands and contracts in accordance with the temperature change, and the wavelength conversion body is less likely to crack or break and emits light with a first luminance ratio Ls/L maintained at 0.9 or less, thereby having good temperature characteristics. When the transparent material is a silicone resin having a Shore A hardness of 30 or more and 80 or less, the transparent material flexibly expands and contracts in accordance with the temperature change, and the wavelength conversion body is less likely to crack or break and emits light with a second luminance ratio B/A maintained at 0.104 or less, thereby having good temperature characteristics. The Shore A hardness of resins can be measured using a Durometer Type A in accordance with JIS K6253.

For example, when a wavelength conversion body is formed by using a resin having a low Shore A hardness of less than 30 as a transparent material, the wavelength conversion body is soft and sticky. Therefore, it may be difficult to cut the wavelength conversion body when individual light emitting devices are separated from a composite substrate including a plurality of light emitting elements, and it may also be difficult to transport and package the wavelength conversion body, resulting in poor mass production.

Thus, by using a resin having a Shore A hardness of 30 or more and 80 or less as a transparent material, the wavelength conversion body or the wavelength conversion member is less likely to crack or break, thereby obtaining a wavelength conversion body having good temperature characteristics.

Transparent Body

The wavelength conversion member may include a transparent body. The transparent body can use a plate-shaped body made of a transparent material such as glass or resin. Examples of the glass include borosilicate glass and quartz glass. Examples of the resin include a silicone resin and an epoxy resin. The thickness of the transparent body may be any thickness as long as the mechanical strength is not reduced in the producing process and the wavelength conversion body can be adequately supported.

Substrate

The substrate is preferably made of an insulating material that is difficult to transmit light from the light emitting element or external light. Examples of the material of the substrate include ceramics such as aluminum oxide and aluminum nitride, and resins such as a phenol resin, an epoxy resin, a polyimide resin, a bismaleimide triazine resin (BT resin), and a polyphthalamide (PPA) resin. Ceramics have high heat resistance and are therefore preferred as substrate materials.

Adhesive Layer

The adhesive layer is interposed between the light emitting element and the wavelength conversion member to fix the light emitting element and the wavelength conversion member together. An adhesive constituting the adhesive layer is preferably made of a material capable of optically connecting the light emitting element and the wavelength conversion member. A material constituting the adhesive layer is preferably at least one resin selected from the group consisting of an epoxy resin, a silicone resin, a phenol resin, and a polyimide resin.

Semiconductor Element

Examples of the semiconductor element optionally provided in the light emitting device include a transistor for controlling the light emitting element and a protective element for suppressing destruction or performance deterioration of the light emitting element due to excessive voltage application. Examples of the protective element include a Zener diode.

Covering Member

An insulating material is preferably used as the material of the covering member. More specific examples thereof include a phenol resin, an epoxy resin, a bismaleimide triazine resin (BT resin), a polyphthalamide (PPA) resin, and a silicone resin. A colorant, a fluorescent material, and a filler may be optionally added to the covering member.

Conductive Members

Bumps can be used as the conductive members. Examples of the material of the bumps include Au and an alloy thereof, and examples of the other conductive members include eutectic solder (Au—Sn), Pb—Sn, and lead-free solder.

Method for Producing Light Emitting Device

The following describes an example of the method for producing a light emitting device. For the details, for example, the disclosure of Japanese Unexamined Patent Publication No. 2014-112635 or Japanese Unexamined Patent Publication No. 2017-117912 may be referred to. The method for producing a light emitting device preferably includes a step of arranging a light emitting element, optionally a step of arranging a semiconductor element, a step of forming a wavelength conversion member including a wavelength conversion body, a step of adhering a light emitting element and a wavelength conversion member, and a step of forming a covering member.

Step of Arranging Light Emitting Element

A light emitting element is arranged on a substrate. For example, a light emitting element and a semiconductor element are flip-chip mounted on a substrate.

Step of Forming Wavelength Conversion Member Including Wavelength Conversion Body In the step of forming a wavelength conversion member including a wavelength conversion body, a wavelength conversion body may be obtained by forming a plate-shaped, sheet-shaped, or layered wavelength conversion body on one surface of a transparent body by a printing method, an adhesive method, a compression molding method, or an electrodeposition method. For example, in the printing method, a wavelength conversion body composition containing a fluorescent material and a resin serving as a transparent material can be printed on one surface of a transparent body to form a wavelength conversion member including a wavelength conversion body.

Wavelength Conversion Body Composition

The wavelength conversion body composition constituting the wavelength conversion body or the wavelength conversion member contains a transparent material, a first fluorescent material, and a second fluorescent material, and may contain a solvent. When the wavelength conversion body composition contains a solvent, the viscosity of the wavelength conversion body composition is lowered, and the density of the first and second fluorescent materials increases in the direction of gravity when the wavelength conversion body composition is cured, so that a wavelength conversion body or wavelength conversion member having different filling ratios of the first and second fluorescent materials in the wavelength conversion body or wavelength conversion member can be produced. The wavelength conversion body or wavelength conversion member is less likely to crack or break due to the presence of a portion having a high filling ratio of the first fluorescent material and the second fluorescent material. By arranging the high-concentration layer side having a high filling ratio of the first fluorescent material and the second fluorescent material in the wavelength conversion body on the light emitting element side, even when a high-output light emitting element is used, the wavelength conversion body is capable of radiating heat generated by the light emitting element through the first fluorescent material and the second fluorescent material in the wavelength conversion body, suppressing breakage or cracking of the resin constituting the wavelength conversion body, and emitting light with a first luminance ratio Ls/L maintained at 0.9 or less, thereby having good temperature characteristics. Also, by arranging the high-concentration layer side having a high filling ratio of the first fluorescent material and the second fluorescent material in the wavelength conversion body on the light emitting element side, even when a high-output light emitting element is used, the wavelength conversion body is capable of radiating heat generated by the light emitting element through the first fluorescent material and the second fluorescent material in the wavelength conversion body, suppressing breakage or cracking of the resin constituting the wavelength conversion body, and emitting light with a second luminance ratio B/A maintained at 0.104 or less, thereby having good temperature characteristics.

The solvent preferably has a boiling point in a range of 150° C. or higher and 320° C. or lower under standard pressure (0.101 MPa), more preferably in a range of 170° C. or higher and 305° C. or lower, even more preferably in a range of 180° C. or higher and 300° C. or lower, and particularly preferably in a range of 190° C. or higher and 290° C. or lower, in view of solubility and volatility in the transparent resin. When the wavelength conversion body composition contains a solvent having a boiling point in a range of 150° C. or higher and 320° C. or lower under standard pressure, the viscosity of the wavelength conversion body composition can be reduced to form a high-concentration layer having a high filling ratio of fluorescent materials including the first fluorescent material and the second fluorescent material, and a low-concentration layer having a low filling ratio of the first fluorescent material and the second fluorescent material in the direction of gravity during curing.

The wavelength conversion body composition preferably has a viscosity, as measured using an E-type viscometer, in a range of 5 mPa·s or more and 400 mPa·s or less at 25° C. and 1 rpm, more preferably in a range of 6 mPa·s or more and 300 mPa·s or less, and even more preferably in a range of 8 mPa·s or more and 250 mPa·s or less.

When the transparent material is a silicone resin and the wavelength conversion body composition contains fluorescent materials in a total amount in a range of 1 part by mass or more and 900 parts by mass or less relative to 100 parts by mass of the transparent material, the content of the solvent is preferably in a range of 1 part by mass or more and 50 parts by mass or less, more preferably in a range of 2 parts by mass or more and 40 parts by mass or less, and even more preferably in a range of 3 parts by mass or more and 30 parts by mass or less relative to 100 parts by mass of the transparent material.

The solvent is a liquid organic compound, some of which evaporates (volatilizes) at room temperature. By heating at, for example, 180° C. or higher, the solvent remaining in the wavelength conversion body composition can be volatilized to cure the wavelength conversion body composition, thereby forming a wavelength conversion body or a wavelength conversion member. Examples of the solvent include hydrocarbon solvents, ketone solvents, alcohol solvents, aldehyde solvents, glycol solvents, ether solvents, ester solvents, glycol ether solvents, and glycol ester solvents. Examples of the hydrocarbon solvents include hexane, xylene, heptane, decane, dodecane, and tridecane. Examples of the ketone solvents include acetone and methyl ethyl ketone. Examples of the alcohol solvents include methyl alcohol, ethyl alcohol, and isopropyl alcohol. Examples of the aldehyde solvents include nonanal and decanal. Examples of the glycol solvents include triethylene glycol. Examples of the ether solvents include diethyl ether. Examples of the ester solvents include methyl acetate and ethyl acetate. Examples of the glycol ether solvents include propylene glycol monomethyl ether. Examples of the glycol ester solvents include ethylene glycol monoethyl ether acetate. The solvent is preferably at least one selected from the group consisting of hexane, xylene, heptane, acetone, ethanol, isopropyl alcohol, decane, dodecane, tridecane, tetradecane, pentadecane, hexadecane, nonanal, decanal, and triethylene glycol. More preferably, the solvent is at least one selected from the group consisting of dodecane, tetradecane, pentadecane, hexadecane, and tridecane. One solvent may be used alone, and two or more solvents may be used in combination.

Wavelength Conversion Body and Wavelength Conversion Member

When the wavelength conversion body composition contains a solvent, it is possible to form a wavelength conversion body or wavelength conversion member divided into a high-concentration layer having a high filling ratio of the first fluorescent material and the second fluorescent material, and a low-concentration layer having a low filling ratio of the first fluorescent material and the second fluorescent material in the direction of gravity during curing of the wavelength conversion body composition. In the present specification, a high-concentration layer having a high filling ratio of the fluorescent materials and a low-concentration layer having a low filling ratio of the fluorescent materials can be observed in the thickness direction of the cross section of the wavelength conversion body. The filling ratio of the fluorescent materials can be measured, as described above, from the area ratio of the resin to the fluorescent materials in the cross section of the wavelength conversion body or the wavelength conversion member observed using an SEM. The boundary between one layer and another layer may not be a straight line, but may be an uneven line.

Step of Adhering Light Emitting Element and Wavelength Conversion Member

In the step of adhering a light emitting element and a wavelength conversion member, the wavelength conversion member is opposed to the light emitting surface of the light emitting element, and the wavelength conversion member is adhered onto the light emitting element by the adhesive layer. When the wavelength conversion member includes a wavelength conversion body and a transparent body, and the wavelength conversion body contains a high-concentration layer having a high filling ratio of fluorescent materials and a low-concentration layer having a low filling ratio of fluorescent materials, it is preferable to arrange the high-concentration layer having a high filling ratio of the wavelength conversion body on the light emitting element side and to adhere the wavelength conversion member onto the light emitting element. The fluorescent materials including the first fluorescent material and the second fluorescent material have higher thermal conductivity than resins. Therefore, by arranging the high-concentration layer having a high filling ratio of the fluorescent materials in the wavelength conversion body on the light emitting element side, the heat dissipation is improved, and the wavelength conversion body is less likely to crack or break, resulting in good temperature characteristics.

Step of Forming Covering Member

In the step of forming a covering member, the side surfaces of the light emitting element and the wavelength conversion member are covered with a covering member composition. The covering member is for reflecting light emitted by the light emitting element, and when the light emitting device includes a semiconductor element too, the semiconductor element is preferably formed so as to be embedded in the covering member. The production method may include a step of separating individual light emitting devices from a composite substrate including a plurality of light emitting elements and semiconductor elements on one substrate.

For example, when a wavelength conversion body is formed by using a resin having a low Shore A hardness of less than 30 as a transparent material, the wavelength conversion body is soft and sticky. Therefore, it may be difficult to cut the wavelength conversion body when individual light emitting devices are separated from a composite substrate including a plurality of light emitting elements, and it may also be difficult to transport and package the wavelength conversion body, resulting in poor mass production.

Thus, by using a resin having a Shore A hardness of 30 or more and 80 or less as a transparent material, the wavelength conversion body or the wavelength conversion member is less likely to crack or break, thereby obtaining a wavelength conversion body having good temperature characteristics.

Headlight

The light emitting device may be arranged on a supporting substrate of a light source unit for a headlight and used as a headlight mounted on a vehicle. The light source unit for a headlight may be, for example, a light source unit disclosed in Japanese Unexamined Patent Publication No. 2003-317513. The light source unit includes, for example, a reflector, a projection lens, and a supporting substrate on which the light emitting device is arranged. The light emission of the light source unit for a headlight may be controlled by a vehicle lamp system as disclosed in, for example, Japanese Unexamined Patent Publication No. H08-67199. The light emitting device may be used as a light source for a headlight used in a turn signal lamp as disclosed in, for example, Japanese Unexamined Patent Publication No. 2005-123165. FIG. 20 is a diagram showing a horizontal cross-sectional view of a headlight 200. FIG. 21 is a diagram showing a front view of the headlight 200. For example, the headlight 200 shown in FIGS. 20 and 21 is mounted on the right front side of the vehicle. The headlight 200 includes a lamp body 24, an outer lens 22, a plurality of substrates 32, a plurality of light emitting devices 100, an optical filter 26, and a light guide member 34. The lamp body 24 and the outer lens 22 form a lamp chamber of the headlight 200, and the plurality of substrates 32 and the plurality of light emitting devices 100 are held in the lamp chamber while being waterproof. The lamp body 24 is formed of, for example, resin so as to cover the plurality of substrates 32 and the plurality of light emitting devices 100 from the rear of the vehicle. The optical filter 26 is fixed to the lamp body 24 by a plurality of screws 28. The plurality of light emitting devices 100 each emit light according to power received from a lighting control unit 12 via the substrates 32.

The headlight may include a plurality of first lamp units each having one light emitting device arranged in one light source unit, as disclosed in, for example, Japanese Unexamined Patent Publication No. 2003-317513. The headlight may also include a second lamp unit in which a plurality of light emitting devices are arranged in one light source unit integrally formed with a plurality of reflectors, a plurality of projection lenses, and a plurality of supporting substrates, as disclosed in, for example, Japanese Unexamined Patent Publication No. 2005-141917. The headlight may include two or more types of light emitting devices having different first luminance ratios Ls/L. The two or more types of light emitting devices having different first luminance ratios Ls/L may each have one light emitting device arranged in one light source unit. The two or more types of light emitting devices having different first luminance ratios Ls/L may be arranged in one light source unit. The headlight may include two or more types of light emitting devices having different second luminance ratios B/A. The two or more types of light emitting devices having different second luminance ratios B/A may each have one light emitting device arranged in one light source unit. The two or more types of light emitting devices having different second luminance ratios B/A may be arranged in one light source unit.

The headlight may include two or more types of light emitting devices, including the aforementioned light emitting device that emits light having a first luminance ratio Ls/L of 0.9 or less as a first light emitting device and the light emitting device that emits light having a first luminance ratio Ls/L of more than 0.9 as a second light emitting device.

The headlight may include two or more types of light emitting devices, including the aforementioned light emitting device that emits light having a second luminance ratio B/A of 0.104 or less as a first light emitting device and the light emitting device that emits light having a second luminance ratio B/A of more than 0.104 as a second light emitting device. The second light emitting device may be a light emitting device that emits light having a first luminance ratio Ls/L of more than 0.9, or a light emitting device that emits light having a second luminance ratio B/A of more than 0.104. The second light emitting device may be in the same form as the first light emitting device shown in, for example, FIGS. 3A and 3B. Examples of the second light emitting device include a light emitting device including a light emitting element having a light emission peak wavelength in a range of 400 nm or more and 490 nm or less and a first fluorescent material having a light emission peak wavelength in a range of 480 nm or more and less than 580 nm, and not including a second fluorescent material. Examples of the first fluorescent material include the same fluorescent material as the first fluorescent material described above. Examples of the second light emitting device include a light emitting element having a light emission peak wavelength in a range of 400 nm or more and 490 nm or less and a rare earth aluminate fluorescent material having a composition represented by the formula (1A) as a first fluorescent material, and not including a second fluorescent material, which emits light having a first luminance ratio Ls/L of more than 0.9 or a second luminance ratio B/A of more than 0.104, and a correlated color temperature in a range of 5,000 K or more and 6,500 K or less.

Vehicle

Examples of the vehicle according to the third embodiment include a vehicle including the aforementioned light emitting device or headlight. Examples of the vehicle including the aforementioned light emitting device or headlight include road transportation vehicles such as motorcycles and automobiles, railway vehicles, and vehicles used for tractor-type construction machines such as ground leveling, transporting, and loading machines, or excavator-type construction machines such as excavating machines.

EXAMPLES

The present disclosure is hereunder specifically described by reference to the following Examples. The present disclosure is not limited to these Examples.

For the light emitting devices according to Examples and Comparative Examples, the following first fluorescent material and second fluorescent material were used.

First Fluorescent Material

For the first fluorescent material, YAG-1, YAG-2, YAG-3, YAG-4, and YAG-5, which were rare earth aluminate fluorescent materials having compositions included in the compositional formula represented by the formula (1A) and having different compositions, were prepared. These first fluorescent materials each have different CIE chromaticity coordinates (x, y), light emission peak wavelength, and full width at half maximum, as shown in Table 1.

Second Fluorescent Material

For the second fluorescent material, BSESN-1 and BSESN-2, which were second nitride fluorescent materials having compositions included in the compositional formula represented by the formula (2A) and having different compositions; SCASN-1 and SCASN-2, which were third nitride fluorescent materials having compositions included in the compositional formula represented by the formula (2B) and having different compositions; and an α-SiAlON fluorescent material having a composition included in the compositional formula represented by the formula (2G) were prepared. These second fluorescent materials each have different CIE chromaticity coordinates (x, y), light emission peak wavelength, and full width at half maximum, as shown in Table 1.

Light Emission Spectrum of Fluorescent Material

Each fluorescent material was irradiated with light having an excitation wavelength of 450 nm using a quantum efficiency measuring apparatus (QE-2000, manufactured by Otsuka Electronics Co., Ltd.) to measure the light emission spectrum at room temperature (approximately 25° C.), and the x and y values in the CIE1931 chromaticity coordinates, the light emission peak wavelength, and the full width at half maximum were determined from each light emission spectrum. The results are shown in Table 1.

Average Particle Diameter of Fluorescent Material

The average particle diameter of each fluorescent material was measured by the FSSS method using a Fisher Sub-Sieve Sizer Model 95 (manufactured by Fisher Scientific Inc.). Specifically, each fluorescent material was weighed to form a sample having a volume of 1 cm³ and the sample was packed in a dedicated tubular container, followed by the flow of dry air at a constant pressure, and the specific surface area was read from the differential pressure and converted to the average particle diameter (Fisher Sub-Sieve Sizer's No.).

TABLE 1

| Fluorescent material | Average particle diameter (μm) | Chromaticity coordinates x | Chromaticity coordinates y | Light emission peak wavelength (nm) | Full width at half maximum (nm) |
|---|---|---|---|---|---|
| YAG-1 | 26.5 | 0.429 | 0.550 | 547 | 111.1 |
| YAG-2 | 23.5 | 0.471 | 0.518 | 564 | 117.7 |
| YAG-3 | 7.0 | 0.464 | 0.523 | 564 | 121.3 |
| YAG-4 | 16.5 | 0.451 | 0.533 | 561 | 115.4 |
| YAG-5 | 16.0 | 0.429 | 0.549 | 551 | 111.9 |
| SCASN-1 | 13.0 | 0.606 | 0.393 | 608 | 73.3 |
| SCASN-2 | 17.0 | 0.608 | 0.391 | 608 | 74.5 |
| BSESN-1 | 18.0 | 0.610 | 0.390 | 610 | 83.2 |
| BSESN-2 | 19.5 | 0.611 | 0.389 | 611 | 83.8 |
| α-SiAlON | 15.5 | 0.566 | 0.433 | 601 | 83.3 |

Examples 1 to 13

The light emitting device of the embodiment shown in FIGS. 3A and 3B was produced.

In the step of arranging a light emitting element, a ceramic substrate made of aluminum nitride was used as the substrate. A light emitting element on which a nitride-based semiconductor layer having a dominant wavelength of 450 nm was laminated was used as the light emitting element. The size of the light emitting element was a substantially square having a planar shape of approximately 1.0 mm square, and the thickness was approximately 0.11 mm. The light emitting element was arranged such that the light emitting surface was on the substrate side and was flip-chip mounted by bumps using conductive members made of Au. The semiconductor element was flip-chip mounted thereon by bumps using conductive members made of Au at a distance from the light emitting element.

A silicone resin a (Shore A hardness of 70) was used as the transparent material. In the step of forming a wavelength conversion member including a wavelength conversion body, the first fluorescent material and the second fluorescent material were used in the composition shown in Table 2, relative to 100 parts by mass of the silicone resin a serving as the transparent material. In Table 2, the fluorescent material total amount indicates the total amount of the first fluorescent material and the second fluorescent material relative to 100 parts by mass of the silicone resin a. In Table 2, the first fluorescent material content (% by mass) and the second fluorescent material content (% by mass) indicate the content of the first fluorescent material and the content of the second fluorescent material, respectively, when the total content of the first fluorescent material and the second fluorescent material is 100% by mass. For the transparent body, a transparent body made of borosilicate glass was prepared, the shape of which was a substantially square having a planar shape of approximately 1.15 mm square, which was approximately 0.15 mm larger in length and width than the planar shape of the light emitting element, and the thickness of which was approximately 0.10 mm. The wavelength conversion body composition was printed on one surface of the transparent body having a substantially square shape by the printing method and cured by heating at 180° C. for 2 hours to form a layered wavelength conversion body having a thickness of approximately 80 μm, thereby forming a wavelength conversion member in which the layered or plate-shaped wavelength conversion body and the transparent body were integrated. In the present specification, the Shore A hardness of the silicone resin was measured using a Durometer Type A (product name: GS-709G, manufactured by TECLOCK Co., Ltd.) in accordance with JIS K6253. The viscosity of the wavelength conversion body composition was measured by the measurement method described below. The viscosity of the wavelength conversion body composition according to Example 3 was 40.4 mPa·s.

In the step of adhering a light emitting element and a wavelength conversion member, one surface of the wavelength conversion member having a substantially square with a planar shape of approximately 1.15 mm square and one surface of the light emitting element having a substantially square with a planar shape of approximately 1.0 mm square were adhered to each other using an adhesive containing a silicone resin, thereby forming an adhesive layer between the light emitting element and the wavelength conversion member.

In the step of forming a covering member, a covering member composition containing a dimethyl silicone resin and titanium oxide particles, in which the amount of the titanium oxide particles was 30 parts by mass relative to 100 parts by mass of the dimethyl silicone resin, was prepared. The covering member composition was filled such that the side surfaces of the light emitting element arranged on the substrate and the wavelength conversion member including the wavelength conversion body and the transparent body were covered with the covering member composition, and the semiconductor element was completely embedded in the covering member composition; and the covering member composition was then cured to form a covering member and a resin package, thereby producing a light emitting device.

Example 14

A light emitting device was produced in the same manner as in Example 2, except that a silicone resin b (Shore A hardness of 70) was used as the transparent material, and the first fluorescent material and the second fluorescent material were used in the composition shown in Table 2, relative to 100 parts by mass of the silicone resin b.

Example 15

A light emitting device was produced in the same manner as in Example 2, except that YAG-5 shown in Table 1 was used as the first fluorescent material, and the first fluorescent material and the second fluorescent material were used in the composition shown in Table 2, relative to 100 parts by mass of the silicone resin a.

Example 16

A light emitting device was produced in the same manner as in Example 9, except that the α-SiAlON fluorescent material shown in Table I was used as the second fluorescent material, and the first fluorescent material and the second fluorescent material were used in the composition shown in Table 2, relative to 100 parts by mass of the silicone resin a. The compositional amount of the first fluorescent material and the second fluorescent material was adjusted such that the light emitting device according to Example 16 emitted light having a chromaticity coordinate value close to that of the light emitting device according to Example 9.

Example 17

A light emitting device was produced in the same manner as in Example 2, except that a silicone resin c (Shore A hardness of 60) was used as the transparent material, and the first fluorescent material and the second fluorescent material were used in the composition shown in Table 2, relative to 100 parts by mass of the silicone resin c.

Example 18

A light emitting device was produced in the same manner as in Example 3, except that a wavelength conversion body composition containing 5 parts by mass of tridecane (boiling point of 234° C.) as a solvent relative to 100 parts by mass of the silicone resin a (Shore A hardness of 70) was used as the wavelength conversion body composition. The wavelength conversion body formed using the aforementioned wavelength conversion body composition had a high-concentration layer having a high filling ratio of the first fluorescent material and the second fluorescent material and a low-concentration layer having a low filling ratio of the first fluorescent material and the second fluorescent material in the thickness direction of the wavelength conversion body, as described below. The light emitting device was produced by arranging the high-concentration layer having a high filling ratio of the first fluorescent material and the second fluorescent material on the light emitting element side. In the light emitting device according to Example 18, the compositional amount of the first fluorescent material and the second fluorescent material was adjusted such that the total amount of the fluorescent materials including the first fluorescent material and the second fluorescent material relative to 100 parts by mass of the silicone resin a was the same value as that of the light emitting device according to Example 3. The viscosity of the wavelength conversion body composition according to Example 18, which was measured by the measurement method described below, was 16.3 mPa·s.

Comparative Example 1

A light emitting device was produced in the same manner as in Example 1; except that the second fluorescent material was not used, YAG-4 shown in Table I was used as the first fluorescent material, and the first fluorescent material was used in the composition shown in Table 2, relative to 100 parts by mass of the silicone resin a.

The light emitting devices were measured as follows. The results are shown in Table 2. In Table 2, the symbol "-" indicates that the second fluorescent material is not used.

Light Emission Spectrum of Light Emitting Device, Chromaticity Coordinates (x, y), And Correlated Color Temperature (K)

For each light emitting device, the light emission spectrum at room temperature (25° C.±5° C.) was measured using an optical measurement system combining a spectrophotometer (PMA-11, manufactured by Hamamatsu Photonics K.K.) and an integral sphere. The x and y values in the CIE1931 chromaticity coordinates and the correlated color temperature (K) according to JIS Z8725 were measured from the light emission spectrum of each light emitting device. The light emission spectrum of each light emitting device, when the maximum light emission intensity is set to 1, is shown in FIGS. 4 to 13.

First Luminance Ratio Ls/L

The light emission spectrum $S (\lambda)$ measured for each light emitting device, the S-cone spectral sensitivity of humans $Gs (\lambda)$ obtained from FIG. 1A, and the spectral luminous efficiency curve for photopic vision of humans $V (\lambda)$ specified by the CIE obtained from FIG. 1B were substituted into the formula (1) to determine a first luminance ratio Ls/L of the light emission of each light emitting device.

Second Luminance Ratio B/A

The light emission spectrum $S (\lambda)$ measured for each light emitting device and the scattering intensity curve $Dc (\lambda)$ obtained from FIG. 2 were substituted into the formula (2) to determine a second luminance ratio B/A of the light emission of each light emitting device.

Relative Luminous Flux (%)

The luminous flux of each light emitting device was measured using a total luminous flux measuring apparatus with an integral sphere. The relative luminous flux of each light emitting device other than Comparative Example 1 was calculated when the luminous flux of the light emitting device according to Comparative Example 1 was set to 100%.

Viscosity of Wavelength Conversion Body Composition

The viscosity of each wavelength conversion body composition used for each wavelength conversion member was measured at 25° C. and 1 rpm using an E-type viscometer (cone rotor (3°×R9.7): TVE-33H, manufactured by Toki Sangyo Co., Ltd.).

TABLE 2

| | First fluorescent material | Second fluorescent material | Fluorescent material total amount (parts by mass) | First fluorescent material content (% by mass) | Second fluorescent material content (% by mass) | Chromaticity coordinates x | y | First luminance ratio Ls/L | Second luminance ratio B/A | Correlated color temperature (K) | Relative luminous flux (%) |
|---|---|---|---|---|---|---|---|---|---|---|---|
| | | | Wavelength conversion body composition | | | Light emitting device | | | | | |
| Example 1 | YAG-1 | SCASN-1 | 240 | 85 | 15 | 0.385 | 0.386 | 0.76 | 0.093 | 3936 | 104.2 |
| Example 2 | YAG-1 | SCASN-2 | 220 | 85 | 15 | 0.381 | 0.374 | 0.79 | 0.095 | 3955 | 101.3 |
| Example 3 | YAG-1 | SCASN-2 | 240 | 85 | 15 | 0.389 | 0.384 | 0.75 | 0.092 | 3821 | 101.7 |
| Example 4 | YAG-1 | SCASN-1 | 280 | 80 | 20 | 0.405 | 0.393 | 0.71 | 0.088 | 3501 | 102.4 |
| Example 5 | YAG-1 | SCASN-2 | 240 | 80 | 20 | 0.400 | 0.379 | 0.75 | 0.091 | 3494 | 99.9 |
| Example 6 | YAG-1 | SCASN-2 | 280 | 82 | 18 | 0.403 | 0.390 | 0.72 | 0.089 | 3539 | 101.5 |
| Example 7 | YAG-1 | SCASN-2 | 280 | 80 | 20 | 0.409 | 0.389 | 0.71 | 0.088 | 3391 | 99.5 |
| Example 8 | YAG-1 | SCASN-2 | 320 | 76 | 24 | 0.433 | 0.400 | 0.66 | 0.082 | 3012 | 97.5 |
| Example 9 | YAG-1 | BSESN-1 | 270 | 85 | 15 | 0.433 | 0.400 | 0.66 | 0.080 | 3014 | 89.9 |
| Example 10 | YAG-2 | BSESN-2 | 130 | 83 | 17 | 0.435 | 0.407 | 0.64 | 0.078 | 3044 | 96.3 |
| Example 11 | YAG-2 | BSESN-2 | 120 | 83 | 17 | 0.423 | 0.393 | 0.69 | 0.082 | 3148 | 95.3 |
| Example 12 | YAG-3 | BSESN-2 | 90 | 75 | 25 | 0.441 | 0.414 | 0.62 | 0.076 | 3005 | 92.8 |
| Example 13 | YAG-3 | BSESN-2 | 80 | 75 | 25 | 0.432 | 0.401 | 0.66 | 0.079 | 3048 | 92.6 |
| Example 14 | YAG-1 | SCASN-2 | 240 | 88 | 12 | 0.377 | 0.384 | 0.77 | 0.096 | 4017 | 105.2 |
| Example 15 | YAG-5 | SCASN-2 | 160 | 85 | 15 | 0.379 | 0.383 | 0.79 | 0.097 | 4158 | 104.4 |
| Example 16 | YAG-1 | α-SiAlON | 140 | 50 | 50 | 0.440 | 0.367 | 0.75 | 0.090 | 2666 | 83.1 |
| Example 17 | YAG-1 | SCASN-2 | 250 | 88 | 12 | 0.378 | 0.385 | 0.77 | 0.103 | 4168 | 101.8 |
| Example 18 | YAG-1 | SCASN-2 | 240 | 85 | 15 | 0.383 | 0.378 | 0.78 | 0.102 | 3923 | 103.9 |
| Comparative Example 1 | YAG-4 | — | 177 | 100 | 0 | 0.324 | 0.339 | 0.98 | 0.110 | 5885 | 100.0 |

The light emitting devices according to Examples 1 to 18 emitted light having a first luminance ratio Ls/L of 0.9 or less. The light emitting devices according to Examples 1 to 18 emitting light with reduced glare.

The light emitting devices according to Examples 1 to 18 emitted light having a second luminance ratio B/A of 0.104 or less. The light emitting devices according to Examples 1 to 18 emitted light that was suppressed in light scattering and reached a relatively long distance.

The light emitting devices according to Examples 1 to 4, 6, and 18 emitted light having a correlated color temperature of 3,500 K or more and less than 4,000 K; emitted light having a low correlated color temperature with a reduced blue light component, wherein the content of the first fluorescent material was in the range of 70% by mass or more and 85% by mass or less relative to the total amount of the first fluorescent material and the second fluorescent material; and emitted light that was reduced in glare, suppressed in light scattering, and reached a relatively long distance.

The light emitting devices according to Examples 5, 7 to 13, and 16 emitted light having a correlated color temperature of 1,800 K or more and less than 3,500 K; emitted light having a low correlated color temperature with a reduced blue light component, wherein the content of the first fluorescent material was in the range of 50% by mass or more and 85% by mass or less relative to the total amount of the first fluorescent material and the second fluorescent material; and emitted light that was reduced in glare, suppressed in light scattering, and reached a relatively long distance.

The light emitting devices according to Examples 14, 15, and 17 emitted light having a correlated color temperature of 4,000 K or more and 5,000 K or less; emitted light having a low correlated color temperature with a reduced blue light component, wherein the content of the first fluorescent material was in the range of 75% by mass or more and 95% by mass or less relative to the total amount of the first fluorescent material and the second fluorescent material; and emitted light that was reduced in glare, suppressed in light scattering, and reached a relatively long distance.

The light emitting device according to Comparative Example 1 emitted light having a first luminance ratio Ls/L of more than 0.9, and the blue light component light, which tends to cause glare, was not reduced. The light emitting device according to Comparative Example 1 also emitted light having a second luminance ratio B/A of more than 0.104, and light scattering was not suppressed. The light emitting device according to Comparative Example 1 emitted light having a correlated color temperature of more than 5,000 K, and the blue light component light, which tends to cause glare, was not reduced.

FIGS. 4 to 13 show the light emission spectrum of the light emitting device according to each of Examples and the light emission spectrum of the light emitting device according to Comparative Example 1. As shown in FIGS. 4 to 12, in the light emission spectrum (spectral radiance) of the light emitting device according to each of Examples 1 to 15 when the maximum light emission intensity was 1, the light emission intensity of the light emitting device according to each of Examples was higher than that of Comparative Example 1 in the light emission spectrum in the range of 500 to 700 nm. As shown in FIG. 13, in the light emission spectrum (spectral radiance) of the light emitting device according to each of Examples 16 to 18 when the maximum light emission intensity was 1, the light emission intensity of the light emitting device according to each of Examples was higher than that of Comparative Example 1 in the light emission spectrum in the range of 550 to 700 nm. In the light emission spectrum (spectral radiance) of the light emitting device according to Example 16, the light emission intensity of the light emitting device according to Example 16 was lower than that of Comparative Example 1 in the light emission spectrum in the range of 500 to 550 nm. However, the temperature characteristics were excellent as described below. The light emitting devices according to Examples were found to emit light having a first luminance ratio Ls/L of 0.9 or less by the light emission spectrum (spectral radiance), indicating that glare was reduced. The light emitting devices according to Examples were also found to emit light having a second luminance ratio B/A of 0.104 or less by the light emission spectrum (spectral radiance), indicating that light scattering was suppressed.

Temperature Characteristic Evaluation 1 (Change Rate of First Luminance Ratio and Change Rate of Second Luminance Ratio)

The light emitting devices according to Example 7, 9, 16, and Comparative Example 1 were allowed to stand in a thermostatic chamber at environmental ambient temperatures Ta° C. (standing time (min)) of −40° C. (60 min), 0° C. (60 min), 25° C. (90 min), 85° C. (60 min), 100° C. (60 min), 110° C. (60 min), 125° C. (60 min), and 150° C. (30 min) while being energized at 1,000 mA; and after each standing time elapsed, the light emission spectrum of each light emitting device was measured under each environmental ambient temperature. The time during which the temperature in the thermostatic chamber where the light emitting devices were allowed to stand was stable at each environmental ambient temperature was defined as the standing time. From the light emission spectrum S (λ) measured for each light emitting device, a first luminance ratio Ls/L and a second luminance ratio B/A were determined. FIG. 14 shows a graph illustrating a relationship between the environmental ambient temperatures and the first luminance ratios of the light emitting devices. FIG. 15 shows a graph illustrating a relationship between the environmental ambient temperatures and the second luminance ratios of the light emitting devices.

From the first luminance ratio or the second luminance ratio at each environmental ambient temperature measured for each light emitting device, a change rate of the first luminance ratio or a change rate of the second luminance ratio was calculated by the following formula (8). The results of the change rate of the first luminance ratio and the change rate of the second luminance ratio of each light emitting device are shown in Table 3.

$$\text{Change rate of first luminance ratio or change rate of second} \qquad (8)$$
$$\text{luminance ratio } (\%) = \{\text{maximum value/minimum value}\} - 1\} \times 100$$

The maximum value in the formula (8) is a maximum value of the first luminance ratio or the second luminance ratio of each light emitting device at each environmental ambient temperature, and the minimum value in the formula (8) is a minimum value of the first luminance ratio or the second luminance ratio of each light emitting device at each environmental ambient temperature.

Temperature Characteristic Evaluation 2 (Correlated Color Temperature)

The light emitting devices according to Example 7, 16, and Comparative Example 1 were allowed to stand in a thermostatic chamber at environmental ambient temperatures Ta° C. (standing time (min)) of −40° C. (60 min), 0° C. (60 min), 25° C. (90 min), 85° C. (60 min), 100° C. (60 min), 110° C. (60 min), 125° C. (60 min), and 150° C. (30 min) while being energized at 1,000 mA; after each standing time elapsed, the light emission spectrum of each light emitting device was measured under each environmental ambient temperature; and a correlated color temperature was determined from the light emission spectrum S(λ) measured for each light emitting device. FIG. 16 shows a graph illustrating a relationship between the environmental ambient temperatures and the correlated color temperatures of each light emitting device.

TABLE 3

| | Change rate | |
| | First luminance ratio Ls/L (%) | Second luminance ratio B/A (%) |
| --- | --- | --- |
| Example 7 | 6.1 | 13.0 |
| Example 9 | 4.0 | 10.5 |
| Example 16 | 2.5 | 9.9 |
| Comparative Example 1 | 9.6 | 16.2 |

As shown in Table 3 and FIGS. 14 and 15, the light emitting devices according to Example 7, 9, and 16 emitted light having a first luminance ratio Ls/L of 0.9 or less and a second luminance ratio B/A of 0.104 or less, regardless of the environmental ambient temperature. The light emitting device according to Example 16 using the α-SiAlON fluorescent material as the second fluorescent material had lower change rates in the first luminance ratio and the second luminance ratio than those of the light emitting devices according to Examples 7 and 9. The light emitting device according to Example 16 had good temperature characteristics, with a low change rate in the first luminance ratio, and emitted light with reduced glare that would be uncomfortable to humans, even when used in, for example, a cold atmosphere of −40° C. or a hot atmosphere of over 100° C. The light emitting device according to Example 16 had good temperature characteristics, with a low change rate in the second luminance ratio, and emitted light that was suppressed in light scattering and reached a relatively long distance, even when used in, for example, a cold atmosphere of −40° C. or a hot atmosphere of over 100° C.

As shown in FIG. 16, the light emitting devices according to Example 7 and 16 emitted light having a correlated color temperature within a predetermined range, and had good temperature characteristics, regardless of the environmental ambient temperature. A change rate of the correlated color temperature was calculated with reference to the calculation formula shown in the formula (8). The light emitting device according to Example 16 had a change rate of the correlated color temperature of 8.2%; the light emitting device according to Example 7 had a change rate of the correlated color temperature of 4.3%; and the light emitting device according to Comparative Example 1 had a change rate of the correlated color temperature of 10.7%. The maximum value in the formula (8) is a maximum value of the correlated color temperature of each light emitting device at each environmental ambient temperature, and the minimum value in the formula (8) is a minimum value of the correlated color temperature of each light emitting device at each environmental ambient temperature.

Confirmation of Filling Ratio of Fluorescent Material in Cross Section 1

The wavelength conversion body used in the light emitting device according to Example 3 and the wavelength conversion body used in the light emitting device according to Example 18 were cut, and the cross sections of the two wavelength conversion bodies were observed using a scanning electron microscope (SEM). The wavelength conversion body used in the light emitting device according to Example 3 and the wavelength conversion body used in the light emitting device according to Example 18 each had a total amount of the first fluorescent material and the second fluorescent material of 240 parts by mass relative to 100 parts by mass of the transparent material. The wavelength conversion body used in the light emitting device according to Example 18 used tridecane as a solvent in the wavelength conversion body composition, so that the viscosity of the wavelength conversion body composition was lowered compared to the wavelength conversion body used in the light emitting device according to Example 3, and a high-concentration layer having a high filling ratio was confirmed in the cross section of the wavelength conversion body.

Temperature Characteristic Evaluation 3

The light emitting devices according to Example 18 and 3 were allowed to stand for 1,000 hours in a thermostatic chamber in an environmental atmosphere having an environmental temperature Ta of 85° C. and a relative humidity of 85% RH while being energized at 1,200 mA and a junction temperature Tj of the light emitting element of 150° C., and the appearance of each light emitting device was observed. The light emitting device according to Example 18, which was energized at 1,200 mA under an atmosphere having a temperature of 85° C. and a relative humidity of 85% RH and lit continuously for 1,000 hours, had no resin cracks or the like even when the surface of the wavelength conversion member in the light emitting device was observed using a microscope (manufactured by Hirox Co., Ltd.). Since the light emitting device according to Example 18 contained a solvent in the wavelength conversion body composition forming the wavelength conversion body, the viscosity of the wavelength conversion body composition was lowered to form a layer having a high filling ratio of the fluorescent materials in the thickness direction, and the layer having a high filling ratio of the fluorescent materials was arranged on the light emitting element side to radiate heat generated by the light emitting element through the fluorescent materials, thereby suppressing breakage or cracking of the resin constituting the wavelength conversion body.

Temperature Characteristic Evaluation 4

The light emitting device according to Example 17 was allowed to stand for 1,000 hours in a thermostatic chamber in an environmental atmosphere having an environmental temperature Ta of 85° C. and a relative humidity of 85% RH while being energized at 1,200 mA and a junction temperature Tj of the light emitting element of 150° C., and the appearance of the light emitting device was observed. The light emitting device according to Example 17, which was energized at 1,200 mA under an atmosphere having a temperature of 85° C. and a relative humidity of 85% RH and lit continuously for 1,000 hours, had no resin cracks even when the surface of the wavelength conversion member in the light emitting device was observed using a microscope (manufactured by Hirox Co., Ltd.). Since the light emitting device according to Example 17 had a Shore A hardness of the silicone resin used in the wavelength conversion body composition of 60, which was sufficiently low, it flexibly expanded and contracted even when continuously lit in an environment having a relatively high temperature of 85° C. and a high relative humidity of 85% RH, and breakage or cracking of the resin constituting the wavelength conversion body could be suppressed.

Confirmation of Filling Ratio of Fluorescent Material in Cross Section 2

The wavelength conversion members used in the light emitting devices according to Example 3, 18, 19, and 20 were evaluated as follows.

Example 19

A light emitting device was produced in the same manner as in Example 3, except that a wavelength conversion body composition containing 5 parts by mass of dodecane (boiling point of 214° C. to 216° C.) as a solvent relative to 100 parts by mass of the silicone resin a (Shore A hardness of 70) was used as the wavelength conversion body composition. The wavelength conversion body formed using the aforementioned wavelength conversion body composition had a high-concentration layer having a high filling ratio of the first fluorescent material and the second fluorescent material and a low-concentration layer having a low filling ratio of the first fluorescent material and the second fluorescent material in the thickness direction of the wavelength conversion body, as described below. The light emitting device was produced by arranging the high-concentration layer having a high filling ratio of the first fluorescent material and the second fluorescent material on the light emitting element side. In the light emitting device according to Example 19, the compositional amount of the first fluorescent material and the second fluorescent material was adjusted such that the total amount of the fluorescent materials including the first fluorescent material and the second fluorescent material relative to 100 parts by mass of the silicone resin a was the same value as that of the light emitting device according to Example 3.

Example 20

A light emitting device was produced in the same manner as in Example 3, except that a wavelength conversion body composition containing 5 parts by mass of hexadecane (boiling point of 287° C.) as a solvent relative to 100 parts by mass of the silicone resin a (Shore A hardness of 70) was used as the wavelength conversion body composition. The wavelength conversion body formed using the aforementioned wavelength conversion body composition had a high-concentration layer having a high filling ratio of the first fluorescent material and the second fluorescent material and a low-concentration layer having a low filling ratio of the first fluorescent material and the second fluorescent material in the thickness direction of the wavelength conversion body, as described below. The light emitting device was produced by arranging the high-concentration layer having a high filling ratio of the first fluorescent material and the second fluorescent material on the light emitting element side. In the light emitting device according to Example 20, the compositional amount of the first fluorescent material and the second fluorescent material was adjusted such that the total amount of the fluorescent materials including the first fluorescent material and the second fluorescent material relative to 100 parts by mass of the silicone resin a was the same value as that of the light emitting device according to Example 3.

Thickness Ratio of High-Concentration Layer and Low-Concentration Layer

The viscosity of the wavelength conversion body composition according to each of Examples 3 and 18 to 20 was measured in the same manner as described above. The cross sections of samples of the wavelength conversion members according to Examples 3 and 18 to 20 were observed using an SEM (SU3500, manufactured by Hitachi High-Technologies Corp.). FIG. 17 shows an SEM micrograph of the cross section of a sample of the wavelength conversion member according to Example 18. In FIG. 17, the white solid and dashed lines are described to explain the thicknesses (heights) T1 through T5, which are described below. A method of calculating the thickness of a high-concentration layer 41a and the thickness of a low-concentration layer 41b is described based on the SEM micrograph in FIG. 17. The thickness (height) of an entire wavelength conversion body 41 of a wavelength conversion member 40 is defined as a first height T1. In the cross section of the wavelength conversion body 41 in the SEM micrograph, a layer in which the total area of the first and second fluorescent materials is larger than the area of the resin is defined as a high-concentration layer 41a. In the cross section of the wavelength conversion body 41 in the SEM micrograph, a layer in which the total area of the first and second fluorescent materials is smaller than the area of the resin is defined as a low-concentration layer 41b. The boundary between the high-concentration layer 41a and the low-concentration layer 41b cannot be indicated by a straight line and is unevenly formed by the shapes of the first and second fluorescent materials. The distance between a portion of the first or second fluorescent materials contained in the high-concentration layer 41a that is closest to a transparent body Examples 3 and 18 to 20, and the thickness (height) ratio of the high-concentration layer and the low-concentration layer of the wavelength conversion bodies according to Examples 3 and 18 to 20. In Table 4, the fluorescent material total amount indicates the total amount of the first fluorescent material and the second fluorescent material relative to 100 parts by mass of the silicone resin. In Table 4, the first fluorescent material content (% by mass) and the second fluorescent material content (% by mass) indicate the content of the first fluorescent material and the content of the second fluorescent material, respectively, when the total content of the first fluorescent material and the second fluorescent material is 100% by mass. In Table 4, the solvent content (parts by mass) indicates the amount of solvent relative to 100 parts by mass of the silicone resin. In Table 4, the thickness (height) ratio of the high-concentration layer and the thickness (height) ratio of the low-concentration layer are values when the total thickness (height) of the wavelength conversion body is 100%.

TABLE 4

| | | | Wavelength conversion body composition | | | | | Wavelength conversion body | |
| | | | | First | Second | | | | |
| | First fluorescent material | Second fluorescent material | Fluorescent material total amount (parts by mass) | fluorescent material content (% by mass) | fluorescent material content (% by mass) | Solvent content (parts by mass) | Viscosity (mPa · s) | Thickness ratio of high-concentration layer (%) | Thickness ratio of low-concentration layer (%) |
|---|---|---|---|---|---|---|---|---|---|
| Example 3 | YAG-1 | SCASN-2 | 240 | 85 | 15 | 0.0 | 40.4 | 93.7 | 6.3 |
| Example 18 | YAG-1 | SCASN-2 | 240 | 85 | 15 | 5.0 (Tridecane) | 16.3 | 69.7 | 30.3 |
| Example 19 | YAG-1 | SCASN-2 | 240 | 85 | 15 | 5.0 (Dodecane) | 8.4 | 67.3 | 32.7 |
| Example 20 | YAG-1 | SCASN-2 | 240 | 85 | 15 | 5.0 (Hexadecane) | 7.1 | 66.6 | 33.4 |

42 and a lower surface 41c of the wavelength conversion body 41 is defined as a second height T2. The distance between a portion of the first or second fluorescent materials contained in the high-concentration layer 41a where the boundary with the low-concentration layer 41b is closest to the lower surface 41c side of the wavelength conversion body 41 and the lower surface 41c of the wavelength conversion body 41 is defined as a third height T3. The average value of the second height T2 and the third height T3 is defined as a fourth height T4, and the fourth height T4 is defined as the thickness (height) T4 of the high-concentration layer 41a. A fifth height T5 is obtained by subtracting the fourth height T4 representing the thickness of the high-concentration layer 41a from the first height T1 representing the thickness of the wavelength conversion body 41, and the fifth height T5 is defined as the thickness (height) T5 of the low-concentration layer 41b. The thickness T4 of the high-concentration layer 41a and the thickness T5 of the low-concentration layer 41b of the wavelength conversion body 41 in the SEM micrograph can be calculated by the following formulas (9) and (10). In the following formulas (9) and (10), T1 to T5 are as described above.

$$\text{Thickness (height) of high−concentration layer } T4 = (T2 + T3)/2 \quad (9)$$

$$\text{Thickness (height) of low−concentration layer } T5 = T1 - T4 \quad (10)$$

Table 4 shows the composition ratio and viscosity of the wavelength conversion body compositions according to The wavelength conversion bodies according to Examples 3 and 18 to 20 all had a high-concentration layer having a high filling ratio of the first and second fluorescent materials and a low-concentration layer having a low filling ratio of the first and second fluorescent materials. In the wavelength conversion bodies of the wavelength conversion members according to Examples 3 and 18 to 20, the thickness ratio of the high-concentration layer was in a range of 60% or more and 95% or less, and the thickness ratio of the low-concentration layer was in a range of 5% or more and 40% or less, relative to 100% of the total thickness. In the wavelength conversion bodies according to Examples 18 to 20 using the wavelength conversion body composition containing a solvent, the thickness ratio of the high-concentration layer was smaller than that of the wavelength conversion body according to Examples 3 using the wavelength conversion body composition containing no solvent; the filling ratio of the first fluorescent material and the second fluorescent material contained in the high-concentration layer was high; and the density of the first fluorescent material and the second fluorescent material in the high-concentration layer was high.

FIG. 18 shows an SEM micrograph of the cross section of a sample of the wavelength conversion member according to Example 18. FIG. 19 shows an SEM micrograph of the cross section of a sample of the wavelength conversion member according to Example 3. The white solid lines shown in FIGS. 18 and 19 are described to explain the thickness (height) of an entire wavelength conversion body 41. The white dashed lines shown in FIGS. 18 and 19 are described to explain the boundary between a high-concentration layer 41*a* and a low-concentration layer 41*b* of the wavelength conversion body 41. In the cross sections of the samples of the wavelength conversion members according to Example 3 and 18, a wavelength conversion member 40 includes a wavelength conversion body 41 and a transparent body 42. The wavelength conversion body 41 includes a high-concentration layer 41*a* having a high filling ratio of a first fluorescent material 71 and a second fluorescent material 72 and a low-concentration layer 41*b* having a low filling ratio of a first fluorescent material 71 and a second fluorescent material 72. In the wavelength conversion body 41 according to Example 18 using the wavelength conversion body composition containing a solvent, the thickness ratio of the high-concentration layer 41*a* was smaller than that of the wavelength conversion body 41 according to Examples 3 using the wavelength conversion body composition containing no solvent; the filling ratio of the first fluorescent material and the second fluorescent material contained in the high-concentration layer 41*a* was high; and the density of the first fluorescent material and the second fluorescent material in the high-concentration layer 41*a* was high. In the wavelength conversion body 41 according to Example 18, the thickness ratio of the low-concentration layer 41*b* was larger than that of the wavelength conversion body 41 according to Examples 3.

INDUSTRIAL APPLICABILITY

The light emitting device according to the embodiment of the present disclosure can be used for a headlight. The headlight including the light emitting device according to the embodiment of the present disclosure can be used for road transportation vehicles such as motorcycles and automobiles, railway vehicles, and vehicles used for tractor-type construction machines such as ground leveling, transporting, and loading machines, or excavator-type construction machines such as excavating machines.

EXPLANATIONS OF LETTERS OR NUMERALS

1: Substrate, 10: Light emitting element, 12: Lighting control unit, 22: Outer lens, 24: Lamp body, 26: Optical filter, 28: Screws, 32: Substrates, 34: Light guide member, 40: Wavelength conversion member, 41: Wavelength conversion body, 41*a*: High-concentration layer, 41*b*: Low-concentration layer, 42: Transparent body, 50: Semiconductor element, 60: Conductive members, 71: First fluorescent material, 72: Second fluorescent material, 80: Adhesive layer, 90: Covering member, 100, 101: Light emitting device, and 200: Headlight.

What is claimed is:

1. A light emitting device, comprising:
   a light emitting element having a light emission peak wavelength in a range of 400 nm or more and 490 nm or less; and
   a wavelength conversion member including a first fluorescent material having a light emission peak wavelength in a range of 480 nm or more and less than 580 nm and a second fluorescent material having a light emission peak wavelength in a range of 580 nm or more and 680 nm or less and having a composition different from that of the first fluorescent material,
   wherein the light emitting device emits light having a first luminance ratio Ls/L, as derived from the following formula (1), of 0.9 or less, wherein the first luminance ratio Ls/L is a ratio of a first effective radiance Ls of light emitted by the light emitting device in a range of 380 nm or more and 780 nm or less in consideration of a spectral luminous efficiency curve for photopic vision of humans specified by the CIE (Commission Internationale de l'Eclairage) and S-cone spectral sensitivity of humans, to a luminance L of the light emitted by the light emitting device in a range of 380 nm or more and 780 nm or less in consideration of spectral luminous efficiency curve for photopic vision of humans:

$$Ls/L = \frac{\int_{380}^{780} S(\lambda)\{1.260 \times Gs(\lambda) + V(\lambda)\}d\lambda}{2.3 \int_{380}^{780} S(\lambda) \times V(\lambda)d\lambda} \qquad (1)$$

wherein S ($\lambda$) represents a spectral radiance of light emitted by the light emitting device, V ($\lambda$) represents a spectral luminous efficiency curve for photopic vision of humans specified by the CIE (Commission Internationale de l'Eclairage), and Gs ($\lambda$) represents an S-cone spectral sensitivity of humans in a wavelength $\lambda$ range of 380 nm or more and 550 nm or less.

2. The light emitting device according to claim 1, wherein the light emitting device emits light having a correlated color temperature of 1,800 K or more and 5,000 K or less.

3. The light emitting device according to claim 1, wherein the first fluorescent material has a light emission spectrum having a full width at half maximum in a range of 90 nm or more and 125 nm or less.

4. The light emitting device according to claim 1, wherein the second fluorescent material has a light emission spectrum having a full width at half maximum in a range of 3 nm or more and 15 nm or less, or a light emission spectrum having a full width at half maximum in a range of 60 nm or more and 120 nm or less.

5. The light emitting device according to claim 1, wherein the first fluorescent material comprises at least one selected from the group consisting of a rare earth aluminate fluorescent material having a composition included in a compositional formula represented by the following formula (1A) and a first nitride fluorescent material having a composition included in a compositional formula represented by the following formula (1B):

$$\text{Ln}^1_3(\text{Al}_{1-a}\text{Ga}_a)_5\text{O}_{12}\text{:Ce} \qquad (1A)$$

wherein Ln$^1$ includes at least one element selected from the group consisting of Y, Gd, Tb, and Lu, and a satisfies $0 \leq a \leq 0.5$; and $$\text{La}_w\text{Ln}^2_x\text{Si}_6\text{N}_y\text{:Ce}_z \qquad (1B)$$

wherein Ln$^2$ includes at least one selected from the group consisting of Y and Gd as an essential component, and may include at least one selected from the group consisting of Sc and Lu, the total of Y and Gd included in Ln$^2$ is 90 mol % or more when the Ln$^2$ elements included in 1 mol of the composition is 100 mol %, and

41 w, x, y, and z each satisfy $1.2 \leq w \leq 2.2$, $0.5 \leq x \leq 1.2$, $10 \leq y \leq 12$, $0.5 \leq z \leq 1.2$, $1.80 < w+x < 2.40$, and $2.9 \leq w+x+z \leq 3.1$.

6. The light emitting device according to claim 1, wherein the second fluorescent material comprises at least one selected from the group consisting of a second nitride fluorescent material having a composition included in a compositional formula represented by the following formula (2A), a third nitride fluorescent material having a composition included in a compositional formula represented by the following formula (2B), a fluoride fluorescent material having a composition included in a compositional formula represented by the following formula (2C), a fluoride fluorescent material having a composition included in a compositional formula represented by the following formula (2C') that is different in composition from the following formula (2C), and an $\alpha$-SiAlON fluorescent material having a composition included in a compositional formula represented by the following formula (2G):

$$M^1_2Si_5N_8:Eu \tag{2A}$$

wherein $M^1$ represents an alkaline earth metal element containing at least one selected from the group consisting of Ca, Sr, and Ba;

$$Sr_qCa_sAl_tSi_uN_v:Eu \tag{2B}$$

wherein q, s, t, u, and v each satisfy $0 \leq q < 1$, $0 < s \leq 1$, $q+s \leq 1$, $0.9 \leq t \leq 1.1$, $0.9 \leq u \leq 1.1$, and $2.5 \leq v \leq 3.5$;

$$A_c[M^2_{1-b}Mn^{4+}_bF_d] \tag{2C}$$

wherein A includes at least one selected from the group consisting of $K^+$, $Li^+$, $Na^+$, $Rb^+$, $Cs^+$, and $NH_4^+$, $M^2$ includes at least one element selected from the group consisting of Group 4 elements and Group 14 elements, b satisfies $0 < b < 0.2$, c represents an absolute value of the charge of $[M^2_{1-b}Mn^{4+}_bF_{d'}]$ ions, and d satisfies $5 < d < 7$;

$$A'_{c'}[M^{2'}_{1-b'}Mn^{4+}_{b'}F_{d'}] \tag{2C'}$$

wherein A' includes at least one selected from the group consisting of $K^+$, $Li^+$, $Na^+$, $Rb^+$, $Cs^+$, and $NH_4^+$, $M^{2'}$ includes at least one element selected from the group consisting of Group 4 elements, Group 13 elements, and Group 14 elements, b' satisfies $0 < b' < 0.2$, c' represents an absolute value of the charge of $[M^{2'}_{1-b'}Mn^{4+}_{b'}F_{d'}]$ ions, and d' satisfies $5 < d' < 7$; and $$M^8_{v3}Si_{12-(w3+x3)}Al_{w3+x3}O_{x3}N_{16-x3}:Eu \tag{2G}$$

42 wherein $M^8$ includes at least one element selected from the group consisting of Li, Mg, Ca, Sr, Y, and lanthanoid elements (excluding La and Ce), and v3, w3, and x3 each satisfy $0 < v3 \leq 2.0$, $2.0 \leq w3 \leq 6.0$, and $0 \leq x3 \leq 1.0$.

7. The light emitting device according to claim 1, wherein the first fluorescent material comprises a rare earth aluminate fluorescent material having a composition included in a compositional formula represented by the following formula (1A), and the second fluorescent material comprises at least one selected from the group consisting of a second nitride fluorescent material having a composition included in a compositional formula represented by the following formula (2A), a third nitride fluorescent material having a composition included in a compositional formula represented by the following formula (2B), and an $\alpha$-SiAlON fluorescent material having a composition included in a compositional formula represented by the following formula (2G):

$$Ln^1_3(Al_{1-a}Ga_a)_5O_{12}:Ce \tag{1A}$$

wherein $Ln^1$ includes at least one element selected from the group consisting of Y, Gd, Tb, and Lu, and a satisfies $0 \leq a \leq 0.5$:

$$M^1_2Si_5N_8:Eu \tag{2A}$$

wherein $M^1$ represents an alkaline earth metal element containing at least one selected from the group consisting of Ca, Sr, and Ba;

$$Sr_qCa_sAl_tSi_uN_v:Eu \tag{2B}$$

wherein q, s, t, u, and v each satisfy $0 \leq q < 1$, $0 < s \leq 1$, $q+s \leq 1$, $0.9 \leq t \leq 1.1$, $0.9 \leq u \leq 1.1$, and $2.5 \leq v \leq 3.5$; and $$M^8_{v3}Si_{12-(w3+x3)}Al_{w3+x3}O_{x3}N_{16-x3}:Eu \tag{2G}$$

wherein $M^8$ includes at least one element selected from the group consisting of Li, Mg, Ca, Sr, Y, and lanthanoid elements (excluding La and Ce), and v3, w3, and x3 each satisfy $0 < v3 \leq 2.0$, $2.0 \leq w3 \leq 6.0$, and $0 < x3 \leq 1.0$.

8. The light emitting device according to claim 1, wherein the wavelength conversion member comprises a silicone resin having a Shore A hardness of 30 or more and 80 or less.

9. The light emitting device according to claim 1, wherein the emitting light device emits light having a correlated color temperature of 1,800 K or more and less than 3,500 K, wherein a content of the first fluorescent material relative to a total amount of the first fluorescent material and the second fluorescent material is in a range of 5% by mass or more and 93% by mass or less.

10. The light emitting device according to claim 1, wherein the light emitting device emits light having a correlated color temperature of 3,500 K or more and less than 4,000 K, wherein a content of the first fluorescent material relative to a total amount of the first fluorescent material and the second fluorescent material is in a range of 20% by mass or more and 95% by mass or less.

11. The light emitting device according to claim 1, wherein the light emitting device emits light having a correlated color temperature of 4,000 K or more and 5,000 K or less, wherein a content of the first fluorescent material relative to a total amount of the first fluorescent material and the second fluorescent material is in a range of 50% by mass or more and 99% by mass or less.

12. The light emitting device according to claim 1,
wherein the wavelength conversion member comprises a wavelength conversion body including the first fluorescent material, the second fluorescent material, and a transparent material,
wherein the wavelength conversion body comprises a high-concentration layer having a high filling ratio of the first fluorescent material and the second fluorescent material, and a low-concentration layer having a low filling ratio of the first fluorescent material and the second fluorescent material, and
wherein the high-concentration layer is arranged on a side of the light emitting element.

13. A headlight, comprising the light emitting device according to claim 1.

14. The headlight according to claim 13, comprising two or more types of light emitting devices each having a different value of the first luminance ratio Ls/L.

15. A headlight, comprising two or more types of light emitting devices including a first light emitting device including the light emitting device according to claim 1, and a second light emitting device emitting light having a first luminance ratio Ls/L, as derived from the following formula (1), of more than 0.9, wherein the first luminance ratio Ls/L is a ratio of a first effective radiance Ls of light emitted by the light emitting device in a range of 380 nm or more and 780 nm or less in consideration of spectral luminous efficiency curve for photopic vision of humans specified by the CIE (Commission Internationale de l'Eclairage) and S-cone spectral sensitivity of humans, to a luminance L of the light emitted by the light emitting device in a range of 380 nm or more and 780 nm or less in consideration of the spectral luminous efficiency curb for photopic vision of humans:

$$Ls/L = \frac{\int_{380}^{780} S(\lambda)\{1.260 \times Gs(\lambda) + V(\lambda)\}d\lambda}{2.3 \int_{380}^{780} S(\lambda) \times V(\lambda)d\lambda} \quad (1)$$

wherein S ($\lambda$) represents a spectral radiance of light emitted by the light emitting device, V ($\lambda$) represents spectral luminous efficiency curve for photopic vision of humans specified by the CIE (Commission Internationale de l'Eclairage), and Gs ($\lambda$) represents an S-cone spectral sensitivity of humans in a wavelength $\lambda$ range of 380 nm or more and 550 nm or less.

16. A light emitting device, comprising:
a light emitting element having a light emission peak wavelength in a range of 400 nm or more and 490 nm or less; and
a wavelength conversion member including a first fluorescent material having a light emission peak wavelength in a range of 480 nm or more and less than 580 nm and a second fluorescent material having a light emission peak wavelength in a range of 580 nm or more and 680 nm or less and having a composition different from that of the first fluorescent material,
the light emitting device emitting light having a second luminance ratio B/A, as derived from the following formula (2), of 0.104 or less,
wherein the second luminance ratio B/A is a ratio of a second effective radiance B of light emitted by the light emitting device in a range of 300 nm or more and 800 nm or less in consideration of a scattering intensity curve for wavelengths when a scattering intensity of Rayleigh scattering at a wavelength of 300 nm is 1, to a radiance A of the light emitted by the light emitting device in a range of 300 nm or more and 800 nm or less:

$$B/A = \frac{\int_{300}^{800} Dc(\lambda) \times S(\lambda)d\lambda}{\int_{300}^{800} S(\lambda)d\lambda} \quad (2)$$

wherein S ($\lambda$) represents a spectral radiance of light emitted by the light emitting device and Dc ($\lambda$) represents a scattering intensity curve for wavelengths when a scattering intensity of Rayleigh scattering at a wavelength of 300 nm is 1 in Rayleigh scattering.

17. The light emitting device according to claim 16, wherein the emitting device emits light having a correlated color temperature of 1,800 K or more and 5,000 K or less.

18. The light emitting device according to claim 16, wherein the first fluorescent material has a light emission spectrum having a full width at half maximum in a range of 90 nm or more and 125 nm or less.

19. The light emitting device according to claim 16, wherein the second fluorescent material has a light emission spectrum having a full width at half maximum in a range of 3 nm or more and 15 nm or less, or a light emission spectrum having a full width at half maximum in a range of 60 nm or more and 120 nm or less.

20. The light emitting device according to claim 16, wherein the first fluorescent material comprises at least one selected from the group consisting of a rare earth aluminate fluorescent material having a composition included in a compositional formula represented by the following formula (1A) and a first nitride fluorescent material having a composition included in a compositional formula represented by the following formula (1B):

$$Ln^1_3(Al_{1-a}Ga_a)_5O_{12}:Ce \quad (1A)$$

wherein Ln$^1$ includes at least one element selected from the group consisting of Y, Gd, Tb, and Lu, and a satisfies $0 \leq a \leq 0.5$; and $$La_w Ln^2_x Si_6 N_y:Ce_z \quad (1B)$$

wherein Ln$^2$ includes at least one selected from the group consisting of Y and Gd as an essential component, and may include at least one selected from the group consisting of Sc and Lu, the total of Y and Gd included in Ln$^2$ is 90 mol % or more when the Ln$^2$ elements included in 1 mol of the composition is 100 mol %, and w, x, y, and z each satisfy $1.2 \leq w \leq 2.2$, $0.5 \leq x \leq 1.2$, $10 \leq y \leq 12$, $0.5 \leq z \leq 1.2$, $1.80 < w+x < 2.40$, and $2.9 \leq w+x+z \leq 3.1$.

21. The light emitting device according to claim 16, wherein the second fluorescent material comprises at least one selected from the group consisting of a second nitride fluorescent material having a composition included in a compositional formula represented by the following formula (2A), a third nitride fluorescent material having a composition included in a compositional formula represented by the following formula (2B), a fluoride fluorescent material having a composition included in a compositional formula represented by the following formula (2C), a fluoride fluorescent material having a composition included in a compositional formula represented by the following formula (2C') that is different in composition from the following formula (2C), and an $\alpha$-SiAlON fluorescent material having a composition included in a compositional formula represented by the following formula (2G):

$$M^1{}_2Si_5N_8:Eu \tag{2A}$$

wherein $M^1$ represents an alkaline earth metal element containing at least one selected from the group consisting of Ca, Sr, and Ba:

$$Sr_qCa_sAl_tSi_uN_v:Eu \tag{2B}$$

wherein q, s, t, u, and v each satisfy $0 \leq q < 1$, $0 < s \leq 1$, $q+s \leq 1$, $0.9 \leq t \leq 1.1$, $0.9 \leq u \leq 1.1$, and $2.5 \leq v \leq 3.5$:

$$A_c[M^2{}_{1-b}Mn^{4+}{}_bF_d] \tag{2C}$$

wherein A includes at least one selected from the group consisting of $K^+$, $Li^+$, $Na^+$, $Rb^+$, $Cs^+$, and $NH_4{}^+$, $M^2$ includes at least one element selected from the group consisting of Group 4 elements and Group 14 elements, b satisfies $0 < b < 0.2$, c represents an absolute value of the charge of $[M^2{}_{1-b}Mn^{4+}{}_bF_d]$ ions, and d satisfies $5 < d < 7$;

$$A'_{c'}[M^{2'}{}_{1-b'}Mn^{4+}{}_{b'}F_{d'}] \tag{2C'}$$

wherein A' includes at least one selected from the group consisting of $K^+$, $Li^+$, $Na^+$, $Rb^+$, $Cs^+$, and $NH_4{}^+$, $M^{2'}$ includes at least one element selected from the group consisting of Group 4 elements, Group 13 elements, and Group 14 elements, b' satisfies $0 < b' < 0.2$, c' represents an absolute value of the charge of $[M^{2'}{}_{1-b'}Mn^{4+}{}_{b'}F_{d'}]$ ions, and d' satisfies $5 < d' < 7$; and $$M^8{}_{v3}Si_{12-(w3+x3)}Al_{w3+x3}O_{x3}N_{16-x3}:Eu \tag{2G}$$

wherein $M^8$ includes at least one element selected from the group consisting of Li, Mg, Ca, Sr, Y, and lanthanoid elements (excluding La and Ce), and v3, w3, and x3 each satisfy $0 < v3 \leq 2.0$, $2.0 \leq w3 < 6.0$, and $0 \leq x3 \leq 1.0$.

22. The light emitting device according to claim 16, wherein the first fluorescent material comprises a rare earth aluminate fluorescent material having a composition included in a compositional formula represented by the following formula (1A), and the second fluorescent material comprises at least one selected from the group consisting of a second nitride fluorescent material having a composition included in a compositional formula represented by the following formula (2A), a third nitride fluorescent material having a composition included in a compositional formula represented by the following formula (2B), and an $\alpha$-SiAlON fluorescent material having a composition included in a compositional formula represented by the following formula (2G):

$$Ln^1{}_3(Al_{1-a}Ga_a)_5O_{12}:Ce \tag{1A}$$

wherein $Ln^1$ includes at least one element selected from the group consisting of Y, Gd, Tb, and Lu, and a satisfies $0 \leq a \leq 0.5$:

$$M^1{}_2Si_5N_8:Eu \tag{2A}$$

wherein $M^1$ represents an alkaline earth metal element containing at least one selected from the group consisting of Ca, Sr, and Ba:

$$Sr_qCa_sAl_tSi_uN_v:Eu \tag{2B}$$

wherein q, s, t, u, and v each satisfy $0 \leq q < 1$, $0 < s \leq 1$, $q+s \leq 1$, $0.9 \leq t \leq 1.1$, $0.9 \leq u \leq 1.1$, and $2.5 \leq v \leq 3.5$; and $$M^8{}_{v3}Si_{12-(w3+x3)}Al_{w3+x3}O_{x3}N_{16-x3}:Eu \tag{2G}$$

wherein $M^8$ includes at least one element selected from the group consisting of Li, Mg, Ca, Sr, Y, and lanthanoid elements (excluding La and Ce), and v3, w3, and x3 each satisfy $0 < v3 \leq 2.0$, $2.0 \leq w3 \leq 6.0$, and $0 \leq x3 \leq 1.0$.

23. The light emitting device according to claim 16, wherein the wavelength conversion member comprises a silicone resin having a Shore A hardness of 30 or more and 80 or less.

24. The light emitting device according to claim 16, wherein the emitting device emits light having a correlated color temperature of 1,800 K or more and less than 3,500 K, wherein a content of the first fluorescent material relative to a total amount of the first fluorescent material and the second fluorescent material is in a range of 5% by mass or more and 93% by mass or less.

25. The light emitting device according to claim 16, wherein the emitting device emits light having a correlated color temperature of 3,500 K or more and less than 4,000 K, wherein a content of the first fluorescent material relative to a total amount of the first fluorescent material and the second fluorescent material is in a range of 20% by mass or more and 95% by mass or less.

26. The light emitting device according to any claim 16, wherein the emitting device emits light having a correlated color temperature of 4,000 K or more and 5,000 K or less, wherein a content of the first fluorescent material relative to a total amount of the first fluorescent material and the second fluorescent material is in a range of 50% by mass or more and 99% by mass or less.

27. The light emitting device according to claim 16,
wherein the wavelength conversion member comprises a wavelength conversion body including the first fluorescent material, the second fluorescent material, and a transparent material,
wherein the wavelength conversion body comprises a high-concentration layer having a high filling ratio of the first fluorescent material and the second fluorescent material, and a low-concentration layer having a low filling ratio of the first fluorescent material and the second fluorescent material, and
wherein the high-concentration layer is arranged on a side of the light emitting element.

28. A headlight, comprising the light emitting device according to claim 16.

29. The headlight according to claim 28, comprising two or more types of light emitting devices each having a different value of the second luminance ratio B/A.

30. A headlight, comprising two or more types of light emitting devices including
a first light emitting device including the light emitting device according to claim 16, and a second light emitting device emitting light having a second luminance ratio B/A, as derived from the following formula (2), of more than 0.104, wherein the second luminance ratio B/A is a ratio of a second effective radiance B of light emitted by the light emitting device in a range of 300 nm or more and 800 nm or less in consideration of a scattering intensity curve for wavelengths when a scattering intensity of Rayleigh scattering at a wavelength of 300 nm is 1, to a radiance A of the light emitted by the light emitting device in a range of 300 nm or more and 800 nm or less:

$$B/A = \frac{\int_{300}^{800} Dc(\lambda) \times S(\lambda)d\lambda}{\int_{300}^{800} S(\lambda)d\lambda} \tag{2}$$

wherein S ($\lambda$) represents a spectral radiance of light emitted by the light emitting device and Dc ($\lambda$) represents a scattering intensity curve for wavelengths when a scattering intensity of Rayleigh scattering at a wavelength of 300 nm is 1 in Rayleigh scattering.

31. A vehicle, comprising the light emitting device according to claim 1.

32. A vehicle, comprising the headlight according to claim 13.

33. A vehicle, comprising the light emitting device according to claim 16.

34. A vehicle, comprising the headlight according to claim 28.

\* \* \* \* \*